(12) United States Patent
Uchida

(10) Patent No.: US 7,230,257 B2
(45) Date of Patent: Jun. 12, 2007

(54) ELECTRON BEAM EXPOSURE APPARATUS

(75) Inventor: Shinji Uchida, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 339 days.

(21) Appl. No.: 11/074,645

(22) Filed: Mar. 9, 2005

(65) Prior Publication Data

US 2005/0205809 A1 Sep. 22, 2005

(30) Foreign Application Priority Data

Mar. 16, 2004 (JP) ............................ 2004-074209

(51) Int. Cl.
*H01J 37/304* (2006.01)
*H01J 37/30* (2006.01)
*G21K 5/10* (2006.01)

(52) U.S. Cl. .............................. 250/492.22; 250/491.1; 250/492.2; 250/492.3; 250/442.11; 250/396 R; 250/398

(58) Field of Classification Search ................ None
See application file for complete search history.

(56) References Cited

U.S. PATENT DOCUMENTS

| | | | |
|---|---|---|---|
| 5,185,530 A | 2/1993 | Norioka et al. | 250/398 |
| 5,508,518 A | 4/1996 | Kendall | 250/492.2 |
| 5,834,783 A | 11/1998 | Muraki et al. | 350/398 |
| 5,973,332 A | 10/1999 | Muraki et al. | 250/492.2 |
| 6,166,387 A | 12/2000 | Muraki et al. | 250/492.2 |
| 6,323,499 B1 * | 11/2001 | Muraki et al. | 250/492.22 |
| 6,744,054 B2 | 6/2004 | Mizouchi et al. | 250/440.11 |
| 6,965,426 B2 | 11/2005 | Takashima | 355/53 |
| 7,057,193 B2 * | 6/2006 | Akutsu | 250/492.22 |
| 2002/0070345 A1 | 6/2002 | Mizouchi et al. | 250/396 R |
| 2004/0142715 A1 | 7/2004 | Takashima | 355/72 |

FOREIGN PATENT DOCUMENTS

| | | |
|---|---|---|
| EP | 0 797 236 A2 | 9/1997 |
| EP | 1 143 492 A1 | 10/2001 |
| EP | 1 215 805 A2 | 6/2002 |
| GB | 1458778 | 12/1976 |
| JP | 4-192245 | 7/1992 |
| JP | 5-74695 | 3/1993 |
| JP | 8-320570 | 12/1996 |
| JP | 9-245708 | 9/1997 |
| JP | 11-111598 | 4/1999 |
| JP | 2002-175770 | 6/2002 |
| JP | 2002-260566 | 9/2002 |
| JP | 2003-288856 | 10/2003 |

OTHER PUBLICATIONS

European Search Report dated Aug. 28, 2006, issued in corresponding European patent application No. EP 05 00 5017, forwarded in a Communication dated Sep. 8, 2006.

* cited by examiner

*Primary Examiner*—Nikita Wells
(74) *Attorney, Agent, or Firm*—Fitzpatrick, Cella, Harper & Scinto

(57) ABSTRACT

An electron beam exposure apparatus comprising: column 1 for irradiating an electron beam to wafer 10 serving as a sample; sample chamber 3 having vacuum pump 40 as a vacuum exhaustion unit for controlling the internal unit to a vacuum atmosphere; stage 4A arranged in the sample chamber 3 for holding and moving the wafer 10; and first mounting 5A for elastically supporting the column 1 with respect to the sample chamber 3.

20 Claims, 12 Drawing Sheets

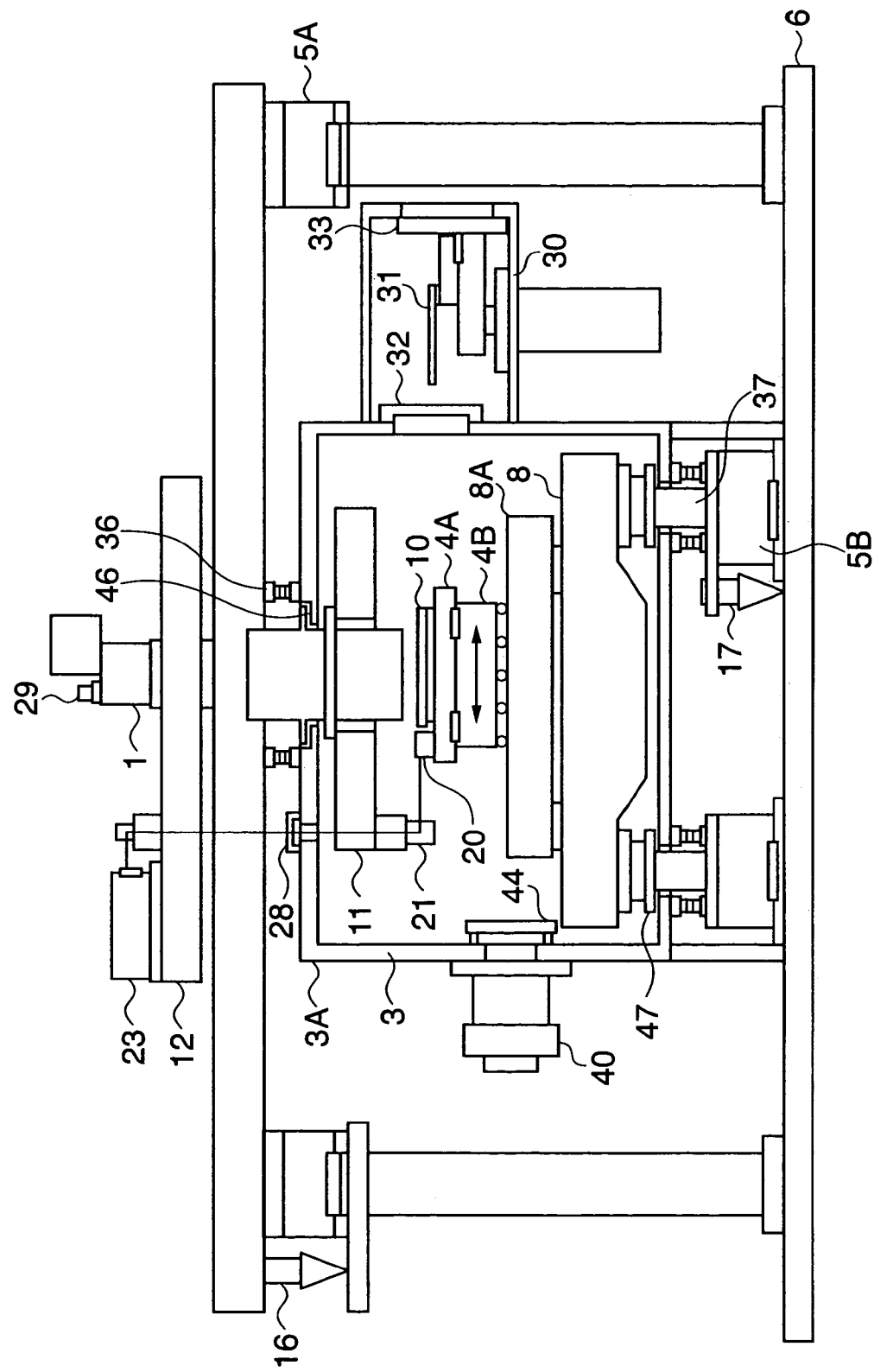

ELECTRON BEAM EXPOSURE APPARATUS

FIELD OF THE INVENTION

The present invention relates to an exposure apparatus and a device manufacturing method, and more particularly, to an electron beam exposure apparatus for drawing or transferring a pattern on an exposure target, such as a substrate, in a vacuum or pressure-reduced atmosphere, and a device manufacturing method utilizing said apparatus.

BACKGROUND OF THE INVENTION

In an apparatus that produces or inspects microscopic patterns such as circuit patterns of magnetic heads and semiconductor devices, circuit patterns of masks, reticles or the like for forming circuit patterns of semiconductor devices and so forth, a charged-particle beam is irradiated to these targets (sample) to produce or inspect the circuit patterns.

Hereinafter, described as an example is an electron beam rendering apparatus which renders a circuit pattern on a sample using an electron ray (electron beam). The electron beam rendering apparatus causes generation of an electron ray in an ultra-high vacuum environment to scan a semiconductor substrate with the electron ray, and forms an LSI pattern on a substrate such as a glass substrate to manufacture masks or reticles used in an exposure apparatus such as a stepper.

FIG. 6 is a view showing a construction of a conventional electron beam rendering apparatus. Referring to FIG. 6, an electron ray outputted from a column 1 (projection system) is irradiated to a sample 10 placed on a stage 4 of a sample chamber 3. The position of the sample 10 is controlled by measuring the position of a mirror 20 fixed to a stage 4 using a laser beam. Since a laser beam in the air is easily influenced by fluctuation of the air and variation of the air pressure, an interferometer 21 is provided in a vacuum. It is preferable to measure the position of the sample 10 with the column 1 as a reference. Therefore, the interferometer 21 is arranged on the lower surface of the upper partition 3A of the sample chamber 3 where the relative position of the sample 10 with respect to the column 1 is easily adjusted.

The sample chamber 3 is mounted on the base 8, which is supported by mounting 5 having a function of vibration isolation. A main table 7 holding the mounting 5 is placed on a base 6 which is placed on a floor 9. The column 1, which is arranged on the upper partition 3A of the sample chamber 3 with high rigidity, is exhausted to a vacuum by a column exhaustion vacuum pump 50, so that the internal atmosphere of the column 1 is maintained in a high vacuum (e.g., equal to or lower than $10^{-4}$ Pa). The sample chamber 3 is exhausted to a vacuum by a sample chamber vacuum pump 40 so that the internal atmosphere of the sample chamber 3 is maintained in a high vacuum (e.g., on the order of $10^{-4}$ Pa).

The conveyance path of the sample 10 is described. The sample 10 is conveyed from an outside, which is an air atmosphere, to a preliminary exhaustion chamber 30 adjacent to the sample chamber 3 by a conveyer 31 provided inside the preliminary exhaustion chamber 30. Then, the preliminary exhaustion chamber 30 is preliminarily exhausted from an air state to a vacuum state by a vacuum pump (not shown). When the preliminary exhaustion chamber 30 has about the same degree of vacuum as that of the sample chamber 3, a valve 32 is opened to convey the sample 10 to the stage 4. The sample 10 is then subjected to circuit pattern rendering or transferring (exposure), conveyed from the sample chamber 3 to the preliminary exhaustion chamber 30, and conveyed to the outside after the preliminary exhaustion chamber 30 returns from the vacuum state to the air atmosphere. The foregoing series of operation enables conveyance of the sample 10 while keeping the sample chamber 3 in a vacuum state, and helps improve the throughput.

The column exhaustion vacuum pump 50 is connected to the column 1 through a column exhaustion bellows 50A, and held by a table 51 supported by the base 8. In the foregoing conventional art, the mounting arrangement method can be found in Japanese Patent Application Laid-Open (KOKAI) No. 05-074695, and the method of setting the sample chamber and the column can be found in Japanese Patent Application Laid-Open (KOKAI) No. 08-320570.

In an electron beam exposure apparatus, in order to prevent an energy loss of an electron ray, the path of the electron ray must be maintained in a high vacuum as mentioned above. However, in the conventional apparatus structure, a large measurement error of the sample position is about to become a problem.

Recently samples (exposure target), particularly wafers, tend to have a large bore diameter to improve productivity, and the number of chip acquisition per wafer is increasing. For this reason, it has become necessary to increase the stroke of the stage 4 for moving the sample 10, and naturally the sample chamber 3 has been enlarged. Therefore, the rigidity of the sample chamber 3 becomes vulnerable to vibration disturbance from the floor 9 or the vacuum pump 40. Because of the above-described reason, the following error factors are reinforced in the conventional apparatus structure.

When the vibration disturbance from the floor 9 or the vacuum pump 40 causes elastic vibration in the sample chamber 3, the attitude of the column 1 mounted to the sample chamber 3 as well as the positions of the interferometer 21 and optical member 23 fluctuate, causing an error. FIG. 7 shows fluctuation of the position of the laser optical member 23 due to elastic vibration of the sample chamber 3. FIG. 8 shows elastic deformation of the upper partition 3A and a slant of the column 1 caused by elastic vibration of the sample chamber 3. Due to these fluctuation, deformation, slant and so forth, the following errors occur.

(1) Electron Beam Shift Due to Displacement $\Delta Y$ of the Column 1

If the column 1 is displaced by $\Delta Y$, the irradiated electron beam shifts. Therefore, it is necessary to add the electron beam shift $\Delta Y$ to the position information of the sample 10, which is measured with the column 1 as a reference.

(2) Length Measurement Error Due to Displacement $\Delta X$ of the Interferometer 21

If the interferometer 21 is displaced by $\Delta X$, an error $\Delta X$ is added to the position information of the sample 10, which is measured with the column 1 as a reference.

(3) Abbe Error Due to Displacement $\Delta Z$ of the Interferometer 21

When the interferometer 21 is displaced by $\Delta Z$, if the stage 4 undergoes pitching $\theta p$, the following length measurement error is generated:

$\Delta Z \cdot \sin \theta p$ (4) Cosine Error Due to Rotation $\Delta \theta$ of the Interferometer 21

If the interferometer 21 rotates by $\Delta \theta$, the following length measurement error is generated:

$L(1-\cos \Delta \theta)$; L: measurement length

As a method of reducing the above-described various errors, it may be considered to increase the rigidity of the partitions that constitute the sample chamber 3. However, in this case, an increased load to the mounting 5 due to an increased mass of the sample chamber 3 is inevitable.

Furthermore, it is possible to reduce the above-described errors (1) and (2) by employing a structure in which a reference beam of the interferometer is irradiated to a reference mirror 25 mounted to the column 1. However, in this case, optical axis adjustment becomes complicated, resulting in an increased operation time.

SUMMARY OF THE INVENTION

The present invention has been made in view of the above-described background, and has as its object to prevent an electron beam from being shifted by a column displacement that can be caused by vibration disturbance from, for instance, the floor 9 or the vacuum pump 40, and to reduce a stage position measurement error caused by a displacement of the interferometer, thereby enabling highly precise exposure.

More concrete objects and other objects of the present invention will be apparent from the above-described various problems and the following descriptions in the embodiments of the present invention.

In order to attain the above-described objects, the first aspect of the present invention provides an electron beam exposure apparatus that comprises a column for irradiating an electron beam to a sample, a sample chamber having a vacuum exhaustion unit for controlling an internal unit to a vacuum atmosphere, a stage, arranged in the sample chamber, for holding and moving the sample, and a first mounting for elastically supporting the column with respect to the sample chamber.

According to preferred embodiments of the present invention, it is preferable to comprise an interferometer, arranged in the sample chamber, for measuring a position of the stage, and a first fixing member for fixing the interferometer to the column.

According to preferred embodiments of the present invention, the stage performs aligning based on a measurement result of the interferometer.

According to preferred embodiments of the present invention, the column comprises a correction system for correcting an orbit of an electron beam based on a measurement result of the interferometer.

According to preferred embodiments of the present invention, it is preferable to comprise an optical system, arranged outside the sample chamber, for supplying the interferometer with measurement light, and a second fixing member for fixing the optical system to the column.

According to preferred embodiments of the present invention, it is preferable to comprise a first bellows partition connected to the column and the sample chamber in a way to seal a gap between the column and the sample chamber.

According to preferred embodiments of the present invention, it is preferable to comprise a first magnetic shield unit for attenuating magnetism that passes through the gap between the column and the sample chamber.

According to preferred embodiments of the present invention, the first magnetic shield unit is configured in a way that a magnetic shield provided on an external wall portion of the column and a magnetic shield provided on an upper wall unit of the sample chamber do not come in contact with each other, and respectively have large areas facing each other.

According to preferred embodiments of the present invention, it is preferable to comprise a first displacement sensor for measuring a relative displacement between the column and the sample chamber, a first accelerometer for measuring acceleration of the column, and a first actuator for changing a relative displacement between the column and the sample chamber based on a measurement result of the first displacement sensor and a measurement result of the first accelerometer.

According to preferred embodiments of the present invention, it is preferable to comprise a stage base, and a second mounting for elastically supporting the stage base with respect to a base member.

According to preferred embodiments of the present invention, it is preferable to comprise a second bellows partition connected to the sample chamber and the second mounting in a way to seal an opening of the sample chamber provided for the second mounting, and a second magnetic shield unit for attenuating magnetism that passes through the opening of the sample chamber provided for the second mounting.

According to preferred embodiments of the present invention, it is preferable to comprise a second displacement sensor for measuring a relative displacement between the stage base and the base member, a second accelerometer for measuring acceleration of the stage base, and a second actuator for changing a relative displacement between the stage base and the base member based on a measurement result of the second displacement sensor and a measurement result of the second accelerometer.

According to preferred embodiments of the present invention, it is preferable to comprise a reaction force receiver for dissipating reaction force to the base member, the reaction force being received by the stage base at the time of acceleration or deceleration of the stage.

According to preferred embodiments of the present invention, the reaction force receiver comprises a strut fixed to the base member, a reaction force transmission member fixed to the stage base, and a linear motor arranged between the strut and the reaction force transmission member, the apparatus further comprises a third bellows partition connected to the sample chamber and the reaction force transmission member in a way to seal an opening of the sample chamber provided for the reaction force transmission member, and a third magnetic shield unit for attenuating magnetism that passes through the opening of the sample chamber provided for the reaction force transmission member.

According to preferred embodiments of the present invention, it is preferable to comprise a counter mass mechanism for moving a counter member so as to cancel reaction force, which is received by the stage base at the time of acceleration or deceleration of the stage.

According to preferred embodiments of the present invention, movement of the stage and movement of the counter member are realized by respective electromagnets, and directions of magnetic flux of the electromagnets are opposite to each other.

According to preferred embodiments of the present invention, it is preferable to comprise a second mounting for elastically supporting the sample chamber with respect to a base member.

According to preferred embodiments of the present invention, it is preferable to comprise a reaction force receiver for dissipating reaction force to the base member, the reaction force being received by the sample chamber at the time of acceleration or deceleration of the stage.

The second aspect of the present invention provides an electron beam exposure apparatus that comprises a column for irradiating an electron beam to a sample, a sample chamber having a vacuum exhaustion unit for controlling an internal unit to a vacuum atmosphere, a stage, arranged in the sample chamber, for holding and moving the sample, and a mounting for elastically supporting the column with respect to a base member.

The third aspect of the present invention provides a device manufacturing method that comprises a step of exposing the sample by the electron beam exposure apparatus according to the above embodiments, and a step of developing the sample which has been subjected to exposure.

As has been described above, according to the present invention, in an exposure apparatus for performing exposure utilizing an electron ray (electron beam) in a vacuum or predetermined pressure atmosphere, it is possible to prevent the electron beam from being shifted by a column displacement that can be caused by vibration disturbance from the floor or the vacuum pump, and to reduce a stage position measurement error caused by a displacement of the interferometer. Furthermore, the invention realizes an effect of providing an electron beam exposure apparatus capable of highly precise exposure.

Other objects and advantages besides those discussed above shall be apparent to those skilled in the art from the description of a preferred embodiment of the invention which follows. In the description, reference is made to accompanying drawings, which form a part thereof, and which illustrate an example of the invention. Such example, however, is not exhaustive of the various embodiments of the invention, and therefore reference is made to the claims which follow the description for determining the scope of the invention.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 11 is a diagram showing a brief construction of an electron beam exposure apparatus according to a modified example of the first embodiment of the present invention.

DETAILED DESCRIPTION OF THE PREFERRED EMBODIMENTS

Hereinafter, preferred embodiments of the present invention will be described in detail in accordance with the accompanying drawings.

First Embodiment

Figure 1:
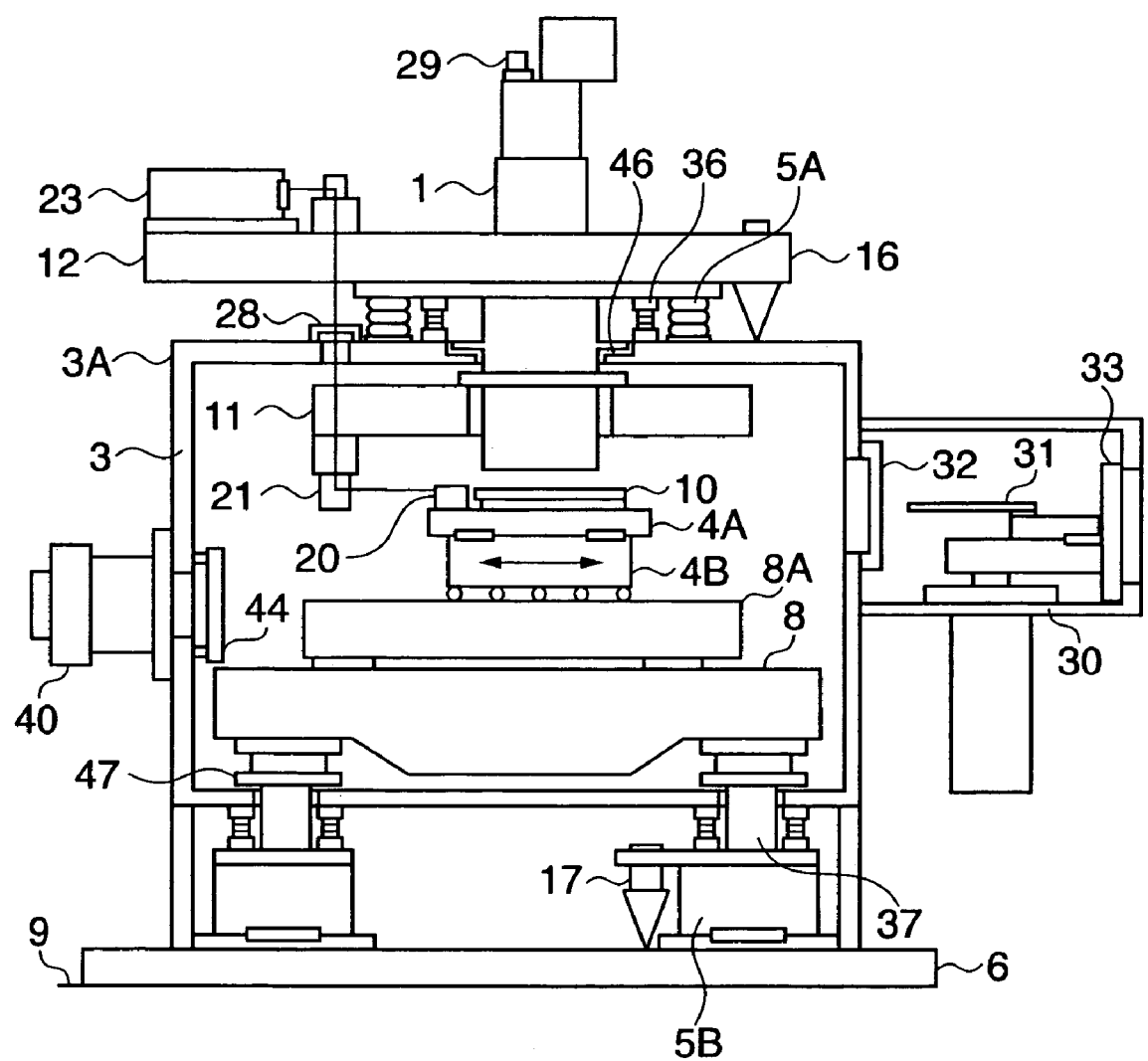
FIG. 1 is a diagram showing a brief construction of an electron beam exposure apparatus according to the first embodiment of the present invention.

FIG. 1 is a diagram showing a brief construction of an electron beam exposure apparatus according to the first embodiment of the present invention. In FIG. 1, a sample chamber 3 which is a vacuum vessel is arranged on a base 6. The sample chamber 3, arranged on the base 6, separates the internal space for processing a sample from the external space by partitions (enclosure members) including, e.g., the bottom partition, side partition, and upper partition 3A. The sample chamber 3 can receive a wafer or the like as a sample of an exposure target. The partitions are provided with magnetic shields made of a magnetic material, so that the geomagnetism is attenuated in the internal space. Provided on the side partition is a vacuum pump opening, where a vacuum pump 40 is arranged for exhausting the sample chamber. On the vacuum pump opening, a magnetic shield 44 is arranged for attenuating the geomagnetism intruding inside the sample chamber 3 from the opening. Because of these magnetic shields, the interior of the sample chamber 3 is kept in the state that is not affected by the geomagnetism, thus preventing an electron beam from being shifted by an influence of the geomagnetism.

Provided in the sample chamber 3 is a base 8 which is elastically supported by the base 6 via a second mounting 5B serving as supporting means. Provided over the base 8 via a stage base 8A is a sample stage 4A for placing a sample and constituting a moving body, and a conveying stage 4B for conveying the sample stage 4A in the horizontal direction. The second bellows 37 connects the second mounting 5B with the sample chamber 3 with low rigidity in a way that vibration disturbance from the floor 9 is not transmitted to the base 8 through the partitions of the sample chamber 3. Also, the second bellows 37 keeps the sample chamber 3 airtight. A second magnetic shield unit 47 is provided below the base 8 without contacting the sample chamber 3 at the opening of the bottom partition for the second mounting, in a way that vibration disturbance from the floor 9 is not transmitted to the base 8 through the partitions of the sample chamber 3. Also, the second magnetic shield unit 47 serves to attenuate the geomagnetism intruding inside the sample chamber 3 from the opening. In particular, in a case of employing the second mounting 5B driven by magnetic force, the second magnetic shield unit 47 attenuates magnetism generated by the second mounting 5B.

Above the sample chamber 3, a column 1 is elastically supported by a first mounting 5A serving as supporting means on the upper partition 3A of the sample chamber 3. The gap between the column 1 that constitutes an electro-optical system and the upper partition 3A of the sample chamber 3 is sealed by the first bellows 36 to keep the sample chamber 3 airtight. The first bellows 36 connects the column 1 with the sample chamber 3 with low rigidity in a way that vibration disturbance from the vacuum pump 40 or the floor 9 is not transmitted to the column 1 through the sample chamber 3. A first magnetic shield unit 46 is provided in a gap between the sample chamber 3 and the column 1 of the upper partition 3A without a contact in a way that vibration disturbance from the vacuum pump 40 or the floor 9 is not transmitted to the column 1 through the sample chamber 3. Also, the first magnetic shield unit 46 serves to attenuate the geomagnetism intruding inside the sample chamber 3 from the gap between the column 1 and the sample chamber 3. The first magnetic shield unit 46 is configured such that the magnetic shield arranged on the column 1 faces the magnetic shield arranged on the upper partition 3A without a contact in a relatively large area, thereby reducing magnetic resistance in the non-contact portion. Therefore, they maintain a physically non-contact state and a connected state as a magnetic circuit.

Figure 12A:
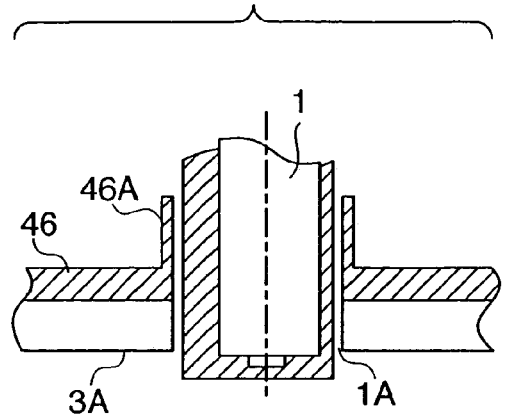
FIGS. 12A to 12F are diagrams showing modified examples of a magnetic shield unit.
Figure 12B:
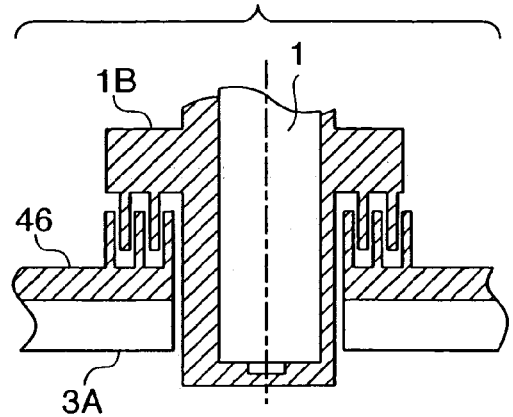
Figure 12C:
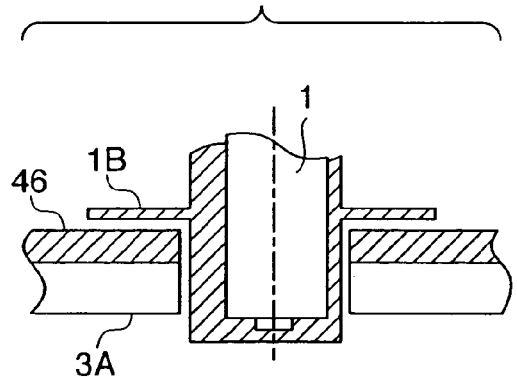
Figure 12D:
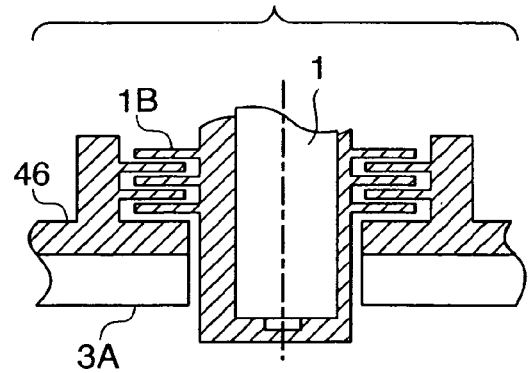
Figure 12E:
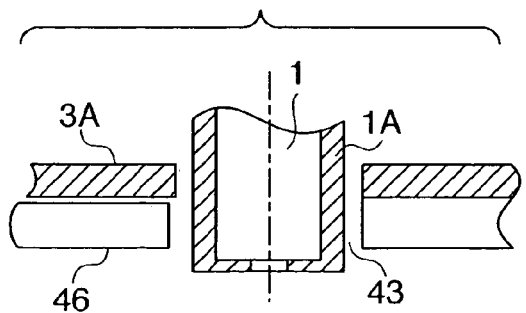
Figure 12F:
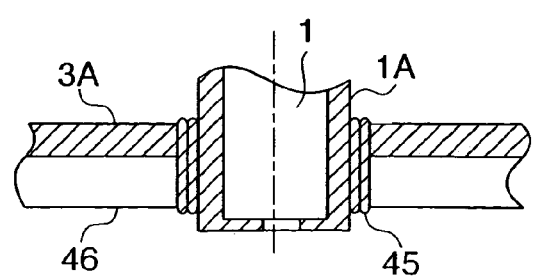

Modified examples of the first magnetic shield unit 46 are shown in FIGS. 12A to 12F, which provide an enlarged view of the first magnetic shield unit 46. In FIG. 12A, a magnetic shield 46A arranged on the upper partition 3A of the sample chamber projects upward along a magnetic shield 1A of the column 1, and faces the column 1 without a contact in a relatively large area along the vertical direction. In FIG. 12B which is a modified example of FIG. 12A, the magnetic shield 46 projecting upward from the upper partition 3A of the sample chamber and the magnetic shield 1B projecting downward from the column 1 face each other in many layers without a contact. In FIG. 12C, the magnetic shield 1B projecting from the column 1 in the horizontal direction and the magnetic shield 46 of the upper partition 3A face each other without a contact in a relatively large area along the horizontal direction. In FIG. 12D which is a modified example of FIG. 12C, the magnetic shield 1B projecting from the column 1 in the horizontal direction and the magnetic shield projecting from the magnetic shield 46 of the upper partition 3A in the horizontal direction face each other in many layers without a contact. Further, as shown in FIGS. 12E and 12F, the first magnetic shield unit 46 may come in contact with the column 1 with low rigidity. In FIG. 12E, magnetic fluid 43 is filled in the portion where the magnetic shield 1A of the column 1 faces the magnetic shield 46 arranged on the upper partition 3A. By virtue of this construction, the magnetic resistance at the facing portion is reduced, and a physically low-rigid state and a connected state as a magnetic circuit are maintained. Similarly in FIG. 12F, a bellows 45 having low rigidity that is made of a magnetic material is arranged in the portion where the magnetic shield 1A of the column 1 faces the magnetic shield 46 arranged on the upper partition 3A.

In FIGS. 12A to 12F, although the magnetic shield arranged on the partition of the sample chamber is provided outside the sample chamber, in reality, it may be arranged inside the sample chamber, or may be provided both inside and outside the sample chamber. Alternatively, the partition of the sample chamber may be formed with a magnetic material to serve as a magnetic shield.

Note that the above-described modified examples of the first magnetic shield unit 46 may be used as a modified example of the second magnetic shield unit 47.

The interferometer 21 constituting measurement means and the column 1 are integrally connected in the sample chamber 3 by the first reference structural member 11 which has high rigidity and serves as a first fixing member. By virtue of connecting the interferometer 21 with the column 1 by the first reference structural member 11 in the sample chamber 3, it is possible to prevent fluctuation in the positional relation between the interferometer 21 and the column I due to elastic vibration of the sample chamber 3 which is caused by vibration disturbance from the vacuum pump 40 or the floor 9.

A laser optical member 23 including a laser head, which is arranged in the air atmosphere for a degas control, is connected to the column 1 by the second reference structural member 12 serving as a second fixing member. The second reference structural member 12 has high rigidity so that the positional relation between the laser optical member 23 and the column 1 does not change. By virtue of connecting the column 1 with the laser optical member 23, constituting the optical system for supplying the interferometer 21 with measurement light, with the use of the second reference structural member 12, it is possible to prevent fluctuation in the positional relation between the laser optical member 23 and the column 1 due to elastic vibration of the sample chamber 3 which is caused by vibration disturbance from the vacuum pump 40 or the floor 9. Furthermore, it is possible to prevent fluctuation in the positional relation between the laser optical member 23 and the interferometer 21.

A movable mirror 20 for position measurement is arranged on the sample stage 4A. A length measurement beam outputted from the laser optical member 23 and passing through the interferometer 21 is incident upon the movable mirror 20. The upper partition 3A of the sample chamber 3 has an opening for introducing the laser beam, and a transmitting glass 28 (window) is arranged to fill in the opening. The length measurement beam outputted from the laser optical member 23 transmits through the transmitting glass 28 and is introduced inside the sample chamber 3. A sealing material, e.g., O-ring, is arranged between the transmitting glass 28 and the upper partition 3A of the sample chamber 3 to keep the sample chamber 3 airtight.

The interferometer 21, comprising a reference mirror, irradiates a laser beam to the reference mirror and the movable mirror 20 fixed to the sample stage 4A, causes interference of the laser beams reflected by the movable mirror 20 and the reference mirror, and detects the interference beam, thereby enabling measurement of the position of the movable mirror 20 (the position of the sample stage 4A or the wafer 10 serving as a sample).

The column 1 is exhausted to a vacuum by a column exhaustion-vacuum pump (not shown) to maintain the internal atmosphere to a high vacuum (e.g., equal to or lower than $10^{-4}$ Pa). Also, the sample chamber 3 is exhausted to a vacuum by the sample chamber vacuum pump 40 to maintain the internal atmosphere to a high vacuum (e.g., on the order of $10^{-4}$ Pa). A column exhaustion bellows (not shown) connects the column 1 with the column exhaustion vacuum pump with low rigidity so that vibration is not transmitted from the column exhaustion vacuum pump to the column 1.

A sample conveyance path is described. The wafer 10 serving as a sample is conveyed from an outside, which is an air atmosphere, to a preliminary exhaustion chamber 30 adjacent to the sample chamber 3 by a conveyer 31 provided inside the preliminary exhaustion chamber 30. Then, the preliminary exhaustion chamber 30 is preliminarily exhausted from an air state to a vacuum state by a vacuum pump (not shown). When the preliminary exhaustion chamber 30 has about the same degree of vacuum as that of the sample chamber 3, a valve 32 is opened to convey the sample to the stage 4A. The sample is then subjected to circuit pattern rendering or transferring, conveyed from the sample chamber 3 to the preliminary exhaustion chamber 30, and conveyed to the outside after the preliminary exhaustion chamber 30 returns from the vacuum state to the air atmosphere.

The construction of the exposure apparatus according to the present embodiment is characterized by having the first reference structural member 11 that integrally connects, with high rigidity, the column 1 with the interferometer 21 provided for measuring the position of the sample stage 4A, and is characterized in that the column 1 is supported by the first mounting 5A. By virtue of this construction, it is possible to reduce vibration disturbance transmitted from the vacuum pump 40 or the floor 9 to the column 1 through the sample chamber 3, which has become a problem in the conventional construction.

More specifically, when the vacuum pump 4.0 operates or the floor 9 vibrates, the vibration disturbance is transmitted to the sample chamber 3, causing elastic vibration in the sample chamber 3. This may cause elastic vibration on the upper partition 3A of the sample chamber 3, to which the column 1 is attached. However, since the column 1 is supported by the first mounting 5A on the upper partition 3A, transmission of the vibration disturbance from the upper partition 3A to the column 1 is reduced. Furthermore, in this embodiment, since the column 1 and the first reference structural member 11 are connected with high rigidity, the distance between the column 1 and the interferometer 21 hardly at all depends on the vibration disturbance from the vacuum pump 40, the floor 9, or the sample chamber 3.

Therefore, the positional relation between the column 1 and the interferometer 21 fixed to the first reference structural member 11 is maintained substantially constant, and it is possible to control with high precision the position of the sample stage 4A (moreover the position of the sample) with respect to the column 1, and to render or transfer a pattern on the sample with high precision.

Furthermore, since the laser optical member 23 is fixed to the column 1 with high rigidity via the second reference structural member 12, the positional relation between the laser optical member 23 and the interferometer 21 does not depend on the elastic vibration of the sample chamber 3. In other words, readjustment such as optical-axis alignment is not necessary.

It is preferable that the first reference structural member 11 and the second reference structural member 12 be configured with a material that can attain high rigidity. Further, a measurement error caused by thermal expansion is not negligible. Therefore, the first reference structural member 11 is preferably configured with a material having a small coefficient of linear thermal expansion, e.g., equal to or smaller than $9 \times 10^{-6}$/K. For such material, for instance, ceramics (e.g., SiC or SiN) or a composite material of ceramics and metal is preferable.

Furthermore, according to the construction of the exposure apparatus in the present embodiment, the sample stage 4A is a six-axis-control precision positioning stage, the conveying stage 4B is a long-stroke stage capable of moving in the horizontal direction, and the sample stage 4A is mounted on the conveying stage 4B. By virtue of the combination of the sample stage 4A and the conveying stage 4B, six-degree-of-freedom precision positioning of the sample as well as long-stroke positioning and conveyance in the horizontal direction are both realized. Hereinafter, details are described.

The sample stage 4A and the conveying stage 4B are arranged on the base 8 which is supported by the second mounting 5B on the base 6. Transmission of vibration disturbance from the floor 9 to the stage is reduced by intermediation of the second mounting 5B. More specifically, a displacement sensor for measuring a relative displacement between the upper part of the second mounting 5B and the base 6, and an accelerometer for measuring acceleration of the upper part of the second mounting 5B are provided. Further, an actuator (not shown) for changing the relative displacement between the upper part of the second mounting 5B and the base 6 is provided between the upper part of the second mounting 5B and the base 6. By measuring the relative displacement between the upper part of the second mounting 5B and the base 6 as well as the acceleration of the upper part of the second mounting 5B, then feedback-controlling the actuator based on the measurement values, the high-frequency component of the vibration disturbance from the floor 9 is prevented from being transmitted to the upper part of the second mounting 5B. Although a low-frequency component of the vibration disturbance from the floor 9 is transmitted to the stage, it is a level that does not cause excitation in the natural frequency of the stage and the natural frequency of the stage base 8A.

The aforementioned actuator is, to be more specific, a linear motor that is a non-contact actuator, or an air spring that is a mechanically low-rigid contact-type actuator or the like, and is configured so that a high-frequency component of vibration disturbance from the floor 9 or the base 6 is not transmitted to the upper part of the second mounting 5B.

Meanwhile, the column 1 is supported by the upper partition 3A of the sample chamber 3 via the first mounting 5A. Because of this construction, in a case where vibration disturbance from the vacuum pump 40 or the floor 9 is transmitted to the upper partition 3A through the sample chamber 3, transmission of the vibration disturbance from the upper partition 3A to the column 1 is reduced. More specifically, a first displacement sensor 16 for measuring a relative displacement between the column 1 and the upper partition 3A, and an accelerometer 29 for measuring acceleration of the column 1 are provided. Further, an actuator (not shown) for changing the relative displacement between the upper partition 3A and the column 1 is provided between the column 1 and the upper partition 3A. By measuring the relative displacement between the column 1 and the upper partition 3A as well as the acceleration of the column 1, then feedback-controlling the actuator based on the measurement values, the high-frequency component of the vibration disturbance from the upper partition 3A is prevented from being transmitted to the column 1. Although a low-frequency component of the vibration disturbance from the upper partition 3A is transmitted to the column 1, it is a level that does not cause excitation in the natural frequency of the column 1 as well as the natural frequency of the first reference structural member 11 and the second reference structural member 12.

The aforementioned actuator is, to be more specific, a linear motor that is a non-contact actuator, or an air spring that is a mechanically low-rigid contact-type actuator or the like, and is configured so that a high-frequency component of vibration disturbance from the upper partition 3A is not transmitted to the column 1.

Therefore, the sample stage 4A and the integrally connected members: column 1, the first reference structural member 11 and the second reference structural member 12, are not excited in an elastic deformation mode, but maintains a state where they respectively oscillate with respect to the floor 9 in a low-frequency band in a rigid mode. By measuring the relative position between the column 1 and the movable mirror 20 (the relative position between the column 1 and the sample stage 4A (moreover the sample)) by the interferometer 21 which is integrally connected to the column 1 by the first reference structural member 11, and positioning the sample stage 4A based on the measured values fed back to the sample stage 4A capable of being controlled in six-axis positioning, the relative alignment between the column 1 and the sample stage 4A (moreover the sample) is performed with precision. Alternatively, the relative position between the column 1 and the movable mirror 20 (the relative position between the column 1 and the sample stage 4A (moreover the sample)) is measured, and the measured values are fed back to a deflection correction system and a focus correction system in the column 1 to correct the orbit (rendering position and focus position) of the electron ray.

In FIG. 1 that shows the present embodiment, the column 1 is supported by the first mounting 5A on the upper partition 3A of the sample chamber 3. However, in FIG. 11 that shows a modified example, the column 1 is supported by the first mounting 5A on the base 6 so that transmission of vibration disturbance from the floor 9 to the column 1 is reduced. In this construction, a displacement sensor for measuring a relative displacement between the column 1 and the floor 9 or the base 6, and an accelerometer for measuring acceleration of the column 1 are provided. Further, an actuator (not shown) for changing the relative displacement between the column 1 and the floor 9 or the base 6 is provided between the column 1 and the floor 9 or the base 6. Other constructions are the same as that of FIG. 1. A low frequency herein means vibration equal to or lower than 10 Hz, and a high frequency means vibration higher than 10 Hz.

Second Embodiment

Figure 2:
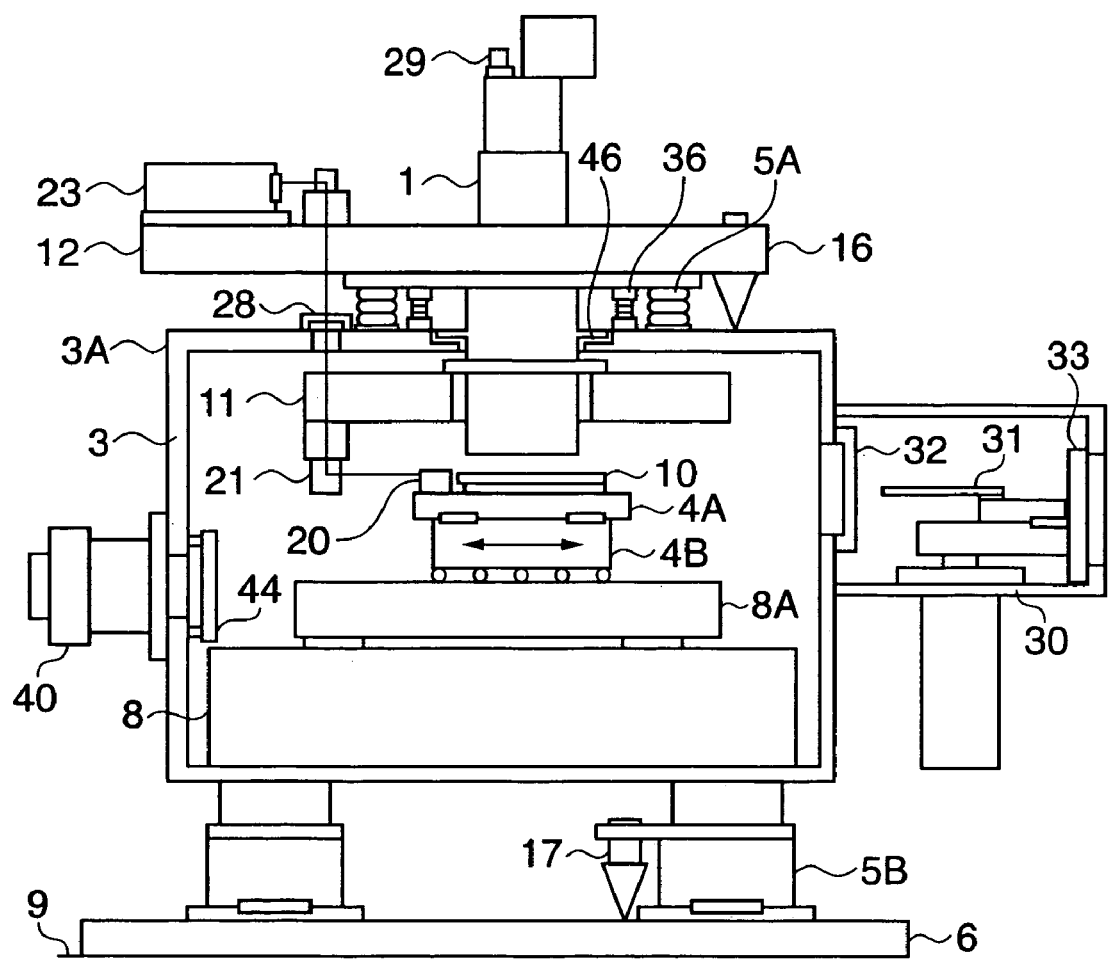
FIG. 2 is a diagram showing a brief construction of an electron beam exposure apparatus according to the second embodiment of the present invention.

FIG. 2 is a diagram showing a brief construction of an electron beam exposure apparatus according to the second embodiment of the present invention. In FIG. 2, a sample chamber 3 which is a vacuum vessel is arranged on a base 6. The sample chamber 3, arranged on the base 6 through the second mounting 5B, separates the internal space for processing a sample from the external space by partitions (enclosure members) including, e.g., the bottom partition, side partition, and upper partition 3A. The partitions are provided with magnetic shields made of a magnetic material, so that the geomagnetism is attenuated in the internal space. Provided on the side partition is a vacuum pump opening, where a vacuum pump 40 is arranged for exhausting the sample chamber. On the vacuum pump opening, a magnetic shield 44 is arranged for attenuating the geomagnetism intruding inside the sample chamber 3 from the opening. Because of these magnetic shields, the interior of the sample chamber 3 is kept in the state that is not affected by the geomagnetism, thus preventing an electron beam from being shifted by an influence of the geomagnetism. Inside the sample chamber 3, a base 8 is arranged. Mounted over the base 8 is a sample stage 4A for placing a sample and a conveying stage 4B for conveying the sample stage 4A in the horizontal direction.

Above the sample chamber 3, the column 1 is supported by the first mounting 5A on the upper partition 3A of the sample chamber 3. The gap between the column 1 and the upper partition 3A of the sample chamber 3 is sealed by the first bellows 36 to keep the sample chamber 3 airtight. The first bellows 36 connects the column 1 with the sample chamber 3 with low rigidity in a way that vibration disturbance from the vacuum pump 40 or the floor 9 is not transmitted to the column 1 through the sample chamber 3. The first magnetic shield unit 46 is provided in a gap between the sample chamber 3 and the column 1 of the upper partition 3A without a contact in a way that vibration disturbance from the vacuum pump 40 or the floor 9 is not transmitted to the column 1 through the sample chamber 3. Also, the first magnetic shield unit 46 serves to attenuate the geomagnetism intruding inside the sample chamber 3 from the gap between the column 1 and the sample chamber 3. The first magnetic shield unit 46 is configured such that the magnetic shield arranged on the column 1 faces the magnetic shield arranged on the upper partition 3A without a contact in a relatively large area, thereby reducing magnetic resistance in the non-contact portion. Therefore, they maintain a physically non-contact state and a connected state as a magnetic circuit.

The interferometer 21 and the column 1 are integrally connected in the sample chamber 3 by the first reference structural member 11 having high rigidity. By virtue of connecting the interferometer 21 with the column 1 by the first reference structural member 11 in the sample chamber 3, it is possible to prevent fluctuation in the positional relation between the interferometer 21 and the column 1 due to elastic vibration of the sample chamber 3 which is caused by vibration disturbance from the vacuum pump 40 or the floor 9.

A laser optical member 23 including a laser head, which is arranged in the air atmosphere for a degas control, is connected to the column 1 by the second reference structural member 12. The second reference structural member 12 has high rigidity so that the positional relation between the laser optical member 23 and the column 1 does not change. By virtue of connecting the column 1 with the laser optical member 23 by the second reference structural member 12, it is possible to prevent fluctuation in the positional relation between the laser optical member 23 and the column 1 due to elastic vibration of the sample chamber 3 which is caused by vibration disturbance from the vacuum pump 40 or the floor 9. Furthermore, it is possible to prevent fluctuation in the positional relation between the laser optical member 23 and the interferometer 21.

A movable mirror 20 for position measurement is arranged on the sample stage 4A. A length measurement beam outputted from the laser optical member 23 and passing through the interferometer 21 is incident upon the movable mirror 20. The upper partition 3A of the sample chamber 3 has an opening for introducing the laser beam, and a transmitting glass 28 (window) is arranged to fill in the opening. The length measurement beam outputted from the laser optical member 23 transmits through the transmitting glass 28 and is introduced inside the sample chamber 3. A sealing material, e.g., O-ring, is arranged between the transmitting glass 28 and the upper partition 3A of the sample chamber 3 to keep the sample chamber 3 airtight.

The interferometer 21, comprising a reference mirror, irradiates a laser beam to the reference mirror and the movable mirror 20 fixed to the sample stage 4A, causes interference of the laser beams reflected by the movable mirror 20 and the reference mirror, and detects the interference beam, thereby enabling measurement of the position of the movable-mirror 20 (the position of the sample stage 4A or a sample).

The column 1 is exhausted to a vacuum by a column exhaustion vacuum pump (not shown) to maintain the internal atmosphere to a high vacuum (e.g., equal to or lower than $10^{-4}$ Pa). Also, the sample chamber 3 is exhausted to a vacuum by the sample chamber vacuum pump 40 to maintain the internal atmosphere to a high vacuum (e.g., on the order of $10^{-4}$ Pa). A column exhaustion bellows (not shown) connects the column 1 with the column exhaustion vacuum pump with low rigidity so that vibration is not transmitted from the column exhaustion vacuum pump to the column 1.

A sample conveyance path is described. A sample is conveyed from an outside, which is an air atmosphere, to the preliminary exhaustion chamber 30 adjacent to the sample chamber 3 by the conveyer 31 provided inside the preliminary exhaustion chamber 30.

Then, the preliminary exhaustion chamber 30 is preliminarily exhausted from an air state to a vacuum state by a vacuum pump (not shown). When the preliminary exhaustion chamber 30 has about the same degree of vacuum as that of the sample chamber 3, the valve 32 is opened to convey the sample to the stage. The sample is then subjected to circuit pattern rendering or transferring, conveyed from the sample chamber 3 to the preliminary exhaustion chamber 30, and conveyed to the outside after the preliminary exhaustion chamber 30 returns from the vacuum state to the air atmosphere.

The construction of the exposure apparatus according to the present embodiment is characterized by having the first reference structural member 11 that integrally connects, with high rigidity, the column 1 with the interferometer 21 provided for measuring the position of the sample stage 4A, and is further characterized in that the column 1 is supported by the first mounting 5A. By virtue of this construction, it is possible to reduce vibration disturbance transmitted from the vacuum pump 40 or the floor 9 to the column 1 through the sample chamber 3, which has become a problem in the conventional construction.

More specifically, when the vacuum pump 40 operates or the floor 9 vibrates, the vibration disturbance is transmitted to the sample chamber 3, causing elastic vibration in the sample chamber 3. This may cause elastic vibration on the upper partition 3A of the sample chamber 3, to which the column 1 is attached. However, since the column 1 is supported by the first mounting 5A on the upper partition 3A, transmission of the vibration disturbance from the upper partition 3A to the column 1 is reduced. Furthermore, in this embodiment, since the column 1 and the first reference structural member 11 are connected with high rigidity, the distance between the column 1 and the interferometer 21 hardly at all depends on the vibration disturbance from the vacuum pump 40, the floor 9, or the sample chamber 3.

Therefore, the positional relation between the column 1 and the interferometer 21 fixed to the first reference structural member 11 is maintained substantially constant, and it is possible to control with high precision the position of the sample stage 4A (moreover the position of the sample) with respect to the column 1, and to render or transfer a pattern on the sample with high precision.

Furthermore, since the laser optical member 23 is fixed to the column 1 with high rigidity via the second reference structural member 12, the positional relation between the laser optical member 23 and the interferometer 21 does not depend on the elastic vibration of the sample chamber 3. In other words, readjustment such as optical-axis alignment is not necessary.

It is preferable that the first reference structural member 11 and the second reference structural member 12 be configured with a material that can attain high rigidity. Further, a measurement error caused by thermal expansion is not negligible. Therefore, the first reference structural member 11 is preferably configured with a material having a small coefficient of linear thermal expansion, e.g., equal to or smaller than $9 \times 10^{-6}$/K.

For such material, for instance, ceramics (e.g., SiC or SiN) or a composite material of ceramics and metal is preferable. Furthermore, according to the construction of the exposure apparatus in the present embodiment, the sample stage 4A is a six-axis-control precision positioning stage, the conveying stage 4B is a long-stroke stage capable of moving in the horizontal direction, and the sample stage 4A is mounted on the conveying stage 4B. By virtue of the combination of the sample stage 4A and the conveying stage 4B, six-degree-of-freedom precision positioning of the sample as well as long-stroke positioning and conveyance in the horizontal direction are both realized. Hereinafter, details are described.

The sample stage 4A and the conveying stage 4B are arranged on the base 8 which is supported by the second mounting 5B on the base 6. Transmission of vibration disturbance from the floor 9 to the stage is reduced by intermediation of the second-mounting 5B. More specifically, a displacement sensor for measuring a relative displacement between the upper part of the second mounting 5B and the base 6, and an accelerometer for measuring acceleration of the upper part of the second mounting 5B are provided. Further, an actuator (not shown) for changing the relative displacement between the upper part of the second mounting 5B and the base 6 is provided between the upper part of the second mounting 5B and the base 6. By measuring the relative displacement between the upper part of the second mounting 5B and the base 6 as well as the acceleration of the upper part of the second mounting 5B, then feedback-controlling the actuator based on the measurement values, the high-frequency component of the vibration disturbance from the floor 9 is prevented from being transmitted to the upper part of the second mounting 5B. Although a low-frequency component of the vibration disturbance from the floor 9 is transmitted to the stage, it is a level that does not cause excitation in the natural frequency of the stage and the natural frequency of the stage base 8A.

The aforementioned actuator is, to be more specific, a linear motor that is a non-contact actuator, or an air spring that is a mechanically low-rigid contact-type actuator or the like, and is configured so that a high-frequency component of vibration disturbance from the floor 9 or the base 6 is not transmitted to the upper part of the second mounting 5B. For the vibration disturbance from the sample chamber vacuum pump 40, there is a vibration disturbance reduction mechanism provided somewhere in the path of transmission of the vibration, transmitted from the sample chamber vacuum pump 40 via the sample chamber partitions to the base 8, the stage base 8A, the conveying stage 4B, and the sample stage 4A, so that a high frequency component is not transmitted, at least, to the sample stage 4A. By virtue of this configuration, vibration disturbance does not cause excitation, at least, in the natural frequency of the sample stage 4A.

Meanwhile, the column 1 is supported by the upper partition 3A of the sample chamber 3 via the first mounting 5A. Because of this construction, in a case where vibration disturbance from the vacuum pump 40 or the floor 9 is transmitted to the upper partition 3A through the sample chamber 3, transmission of the vibration disturbance from the upper partition 3A to the column 1 is reduced. More specifically, a first displacement sensor 16 for measuring a relative displacement between the column 1 and the upper partition 3A, and an accelerometer 29 for measuring acceleration of the column 1 are provided. Further, an actuator (not shown) for changing the relative displacement between the upper partition 3A and the column 1 is provided between the column 1 and the upper partition 3A. By measuring the relative displacement between the column 1 and the upper partition 3A as well as the acceleration of the column 1, then feedback-controlling the actuator based on the measurement values, the high-frequency component of the vibration disturbance from the upper partition 3A is prevented from being transmitted to the column 1. Although a low-frequency component of the vibration disturbance from the upper partition 3A is transmitted to the column 1, it is a level that does not cause excitation in the natural frequency of the column 1 as well as the natural frequency of the first reference structural member 11 and the second reference structural member 12.

The aforementioned actuator is, to be more specific, a linear motor that is a non-contact actuator, or an air spring that is a mechanically low-rigid contact-type actuator or the like, and is configured so that a high-frequency component of vibration disturbance from the upper partition 3A is not transmitted to the column 1.

Therefore, the sample stage 4A and the integrally connected members: column 1, the first reference structural member 11 and the second reference structural member 12, are not excited in an elastic deformation mode, but maintains a state where they respectively oscillate with respect to the floor 9 in a low-frequency band in a rigid mode. By measuring the relative position between the column 1 and the movable mirror 20 (the relative position between the column 1 and the sample stage 4A (moreover the sample)) by the interferometer 21 which is integrally connected to the column 1 by the first reference structural member 11, and positioning the sample stage 4A based on the measured values fed back to the sample stage 4A capable of being controlled in six-axis positioning, the relative alignment between the column 1 and the sample stage 4A (moreover the sample) is performed with precision. Alternatively, the relative position between the column 1 and the movable mirror 20 (the relative position between the column 1 and the sample stage 4A (moreover the sample)) is measured, and the measured values are fed back to a deflection correction system and a focus correction system in the column 1 to correct the orbit (rendering position and focus position) of the electron ray.

In the present embodiment, although the column 1 is supported by the first mounting 5A on the upper partition 3A of the sample chamber 3, it may be supported by the first mounting 5A on the floor 9 or the base 6. In this construction, a displacement sensor for measuring a relative displacement between the column 1 and the floor 9 or the base 6, and an accelerometer for measuring acceleration of the column 1 are provided. Further, an actuator (not shown) for changing the relative displacement between the column 1 and the floor 9 or the base 6 is provided between the column 1 and the floor 9 or the base 6. A low frequency herein means vibration equal to or lower than 10 Hz, and a high frequency means vibration higher than 10 Hz.

The present embodiment can be established without the aforementioned second mounting 5B. In this case, there is a vibration disturbance reduction mechanism provided somewhere in the path of transmission of the vibration, transmitted from the floor 9 to the base 6, the bottom partition, the base 8, the stage base 8A, the conveying stage 4B, and the sample stage 4A, so that a high frequency component is not transmitted, at least, to the sample stage 4A. By virtue of this configuration, vibration disturbance does not cause excitation, at least, in the natural frequency of the sample stage 4A.

Third Embodiment

Figure 3:
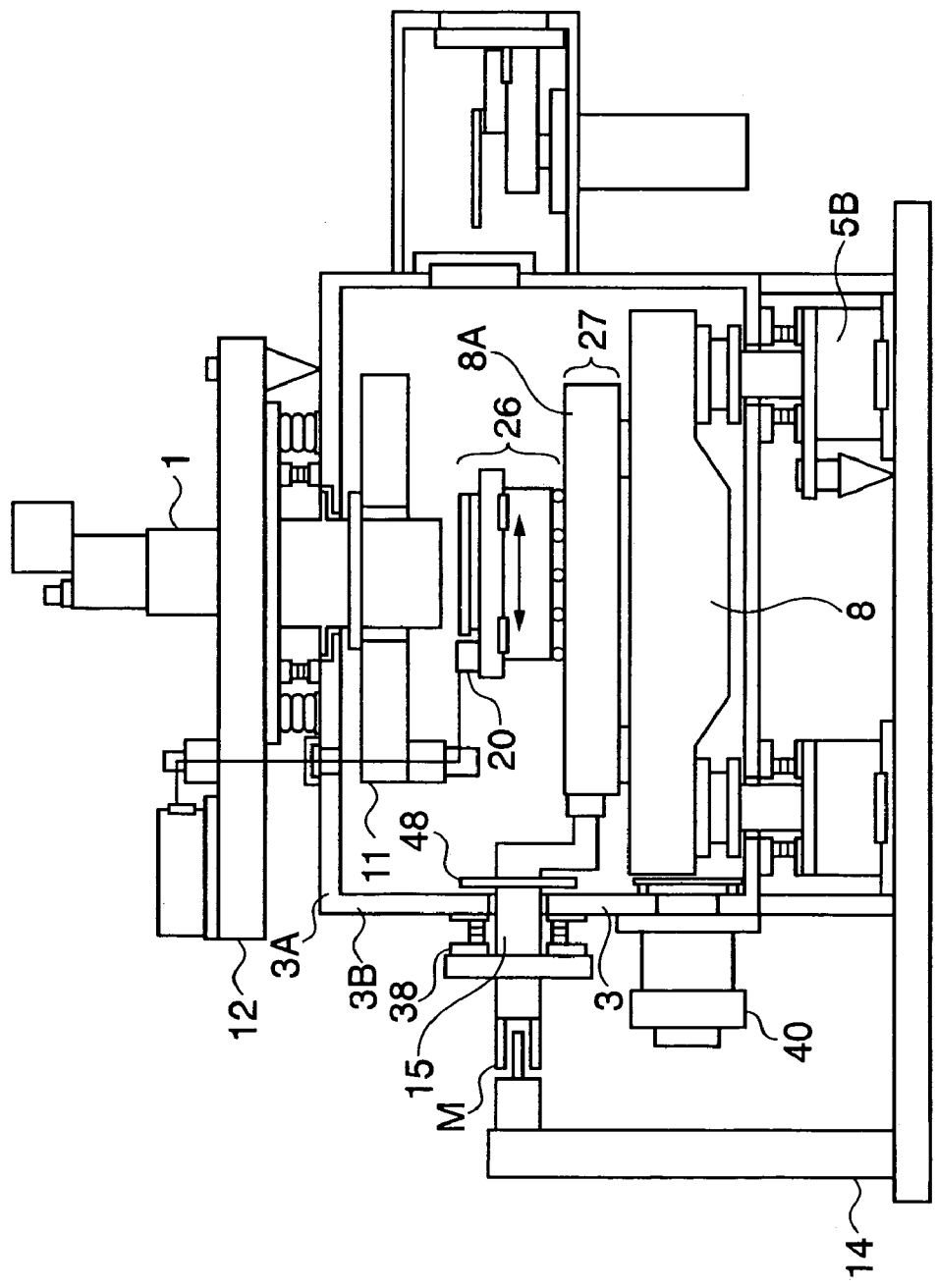
FIG. 3 is a diagram showing a brief construction of an electron beam exposure apparatus according to the third embodiment of the present invention.

FIG. 3 is a diagram showing a brief construction of an electron beam exposure apparatus according to the third embodiment of the present invention. In FIG. 3, the sample chamber 3, the column 1, the stages 26 and 27 have constructions according to the first embodiment. A reaction force receiver of the third embodiment, which is added to the construction of the first embodiment, is described. By virtue of providing the reaction force receiver, it is possible to reduce oscillation and vibration on the entire portion above the second mounting 5B, which is generated by the reaction force caused by counteraction of acceleration or deceleration of the conveying stage 26. Furthermore, since the relative position between the column 1 and the movable mirror 20 (consequently the relative position between the column 1 and the sample stage 4A (moreover the sample)) is servo-controlled, it is possible to reduce vibration of the column 1, the first reference structural member 11, and the second reference structural member 12.

A reaction force transmission member 15, having high rigidity, is arranged between the stage base 8A and a linear motor M outside the sample chamber 3. The reaction force transmission member 15 serves to transmit the reaction force, generated by counteraction of acceleration or deceleration of the conveying stage 4B at the time of acceleration/deceleration of the conveying stage 4B, from inside the sample chamber 3 to outside the sample chamber 3 through the sample chamber opening. A third bellows 38 connects the reaction force transmission member 15 with the sample chamber 3 with low rigidity in a way that vibration disturbance from the floor or the vacuum pump 40 is not transmitted to the reaction force transmission member 15 through the partitions of the sample chamber 3. Also, the third bellows 38 keeps the sample chamber 3 airtight. A third magnetic shield unit 48-is provided to the reaction force transmission member 15 without contacting the sample chamber 3 at the opening of the side partition 3B for the reaction force transmission member, in a way that vibration disturbance from the floor or the vacuum pump 40 is not transmitted to the reaction force transmission member 15 through the partitions of the sample chamber 3. Also, the third magnetic shield unit 48 serves to attenuate the geomagnetism intruding inside the sample chamber 3 from the opening. In particular, in a case of employing the linear motor M driven by magnetic force, the third magnetic shield unit 48 also attenuates magnetism generated by the linear motor M. Furthermore, for another configuration of the third magnetic shield unit 48, modified examples of the first magnetic shield unit 46 shown in FIGS. 12A to 12F may be utilized. The linear motor M is arranged between the reaction force transmission member 15 and a strut 14 on the floor, and generates opposing force against the reaction force transmitted through the reaction force transmission member 15.

In a case where the conveying stage is horizontally accelerated in FIG. 3, the movable part 26 of the conveying stage employs an actuator (not shown) provided on the conveying stage to produce thrust between the movable part 26 and stationary part 27 of the conveying stage, thereby obtaining acceleration force. Because of the counteraction of the acceleration force (thrust), the stationary part 27 of the conveying stage obtains reaction force. In FIG. 3, although the stage base 8A serves as the stationary part 27 of the conveying stage, depending on the construction of the stage, the stationary part of the conveying stage is not limited to the stage base 8A. The reaction force transmission member 15, which connects the stage base 8A with the linear motor M through the sample chamber opening, transmits the reaction force obtained by the stage base 8A to the linear motor M arranged outside the sample chamber 3. The linear motor M, arranged between the reaction force transmission member 15 and the strut 14 on the floor, generates an equal amount of force, opposing against the reaction force transmitted through the reaction force transmission member 15, to cancel the reaction force. In this stage, in order not to generate torque in the vertical direction with respect to the drawing in FIG. 3 (pitching direction) due to the output of the linear motor M and the reaction force, the position of the linear motor M in the height direction is set about equal to the barycenter of the movable part 26 of the conveying stage. Furthermore, two of the reaction force receivers are provided in the vertical direction with respect to the drawing in FIG. 3 so as not to generate torque in the vertical direction (rolling direction). The reaction force receivers generate opposing force against the reaction force at two positions, and output the force in a way that the resultant force has an equal amount but an opposite direction to that of the reaction force, and has zero torque. The above description applies to the case of decelerating the conveying stage. It is effective that the linear motor M generates opposing force against the reaction force in real time and performs feedback controlling or feedforward controlling on the acceleration or deceleration of the conveying stage. The linear motor M that is a non-contact actuator reduces vibration disturbance from the floor which is transmitted to the reaction force transmission member 15 through the strut 14.

The above description has been given on a case where the conveying stage is accelerated or decelerated in the horizontal direction in FIG. 3. The similar description applies to a case where the conveying stage is accelerated or decelerated in the vertical direction with respect to the drawing. To cancel the reaction force in this case, two reaction force receivers (not shown) are provided next to the sample chamber 3 in the vertical direction with respect to the drawing. By virtue of providing the reaction force receivers, it is possible to reduce oscillation and vibration on the entire portion above the second mounting 5B, which is generated by the reaction force caused by counteraction of acceleration or deceleration of the conveying stage. Furthermore, since the relative position between the column 1 and the movable mirror 20 (consequently the relative position between the column 1 and the sample stage 4A (moreover the sample)) is servo-controlled, it is possible to reduce vibration of the column 1, the first reference structural member 11, and the second reference structural member 12.

Fourth Embodiment

Figure 4:
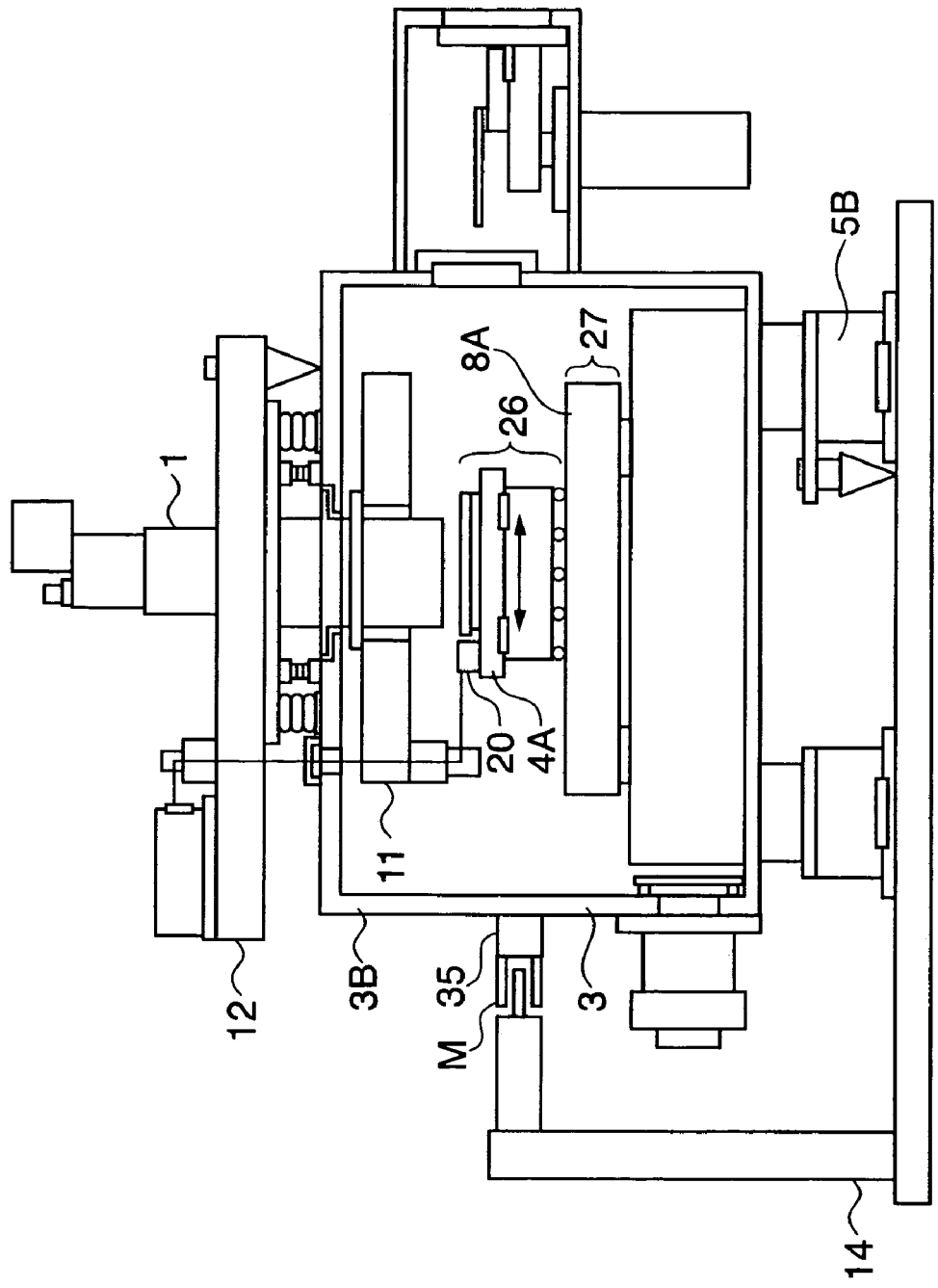
FIG. 4 is a diagram showing a brief construction of an electron beam exposure apparatus according to the fourth embodiment of the present invention.

FIG. 4 is a diagram showing a brief construction of an electron beam exposure apparatus according to the fourth embodiment of the present invention. In FIG. 4, the sample chamber 3, the column 1, and the stages 26 and 27 have constructions according to the configuration mounted on the second mounting 5B in the second embodiment. A reaction force receiver of the fourth embodiment, which is added to the construction of the second embodiment, is described. By virtue of providing the reaction force receiver, it is possible to reduce oscillation and vibration on the entire portion above the second mounting 5B, which is generated by the reaction force caused by counteraction of acceleration or deceleration of the conveying stage 26. Furthermore, since the relative position between the column 1 and the movable mirror 20 (consequently the relative position between the column 1 and the sample stage 4A (moreover the sample)) is servo-controlled, it is possible to reduce vibration of the column 1, the first reference structural member 11, and the second reference structural member 12.

A reaction force transmission member 35, having high rigidity, is arranged between the sample chamber side partition 3B and the linear motor M outside the sample chamber 3. The reaction force transmission member 35 serves to transmit the reaction force, generated by counteraction of acceleration or deceleration of the conveying stage 26 at the time of acceleration/deceleration of the conveying stage 26, from the sample chamber side partition 3B to the linear motor M outside the sample chamber 3. The linear motor M is arranged between the reaction force transmission member 35 and the strut 14 on the floor, and generates opposing force against the reaction force transmitted through the reaction force transmission member 35.

In a case where the conveying stage 26 is horizontally accelerated in FIG. 4, the movable part 26 of the conveying stage employs an actuator (not shown) provided on the conveying stage to produce thrust between the movable part 26 and stationary part 27 of the conveying stage, thereby obtaining acceleration force. Because of the counteraction of the acceleration force (thrust), the stationary part 27 of the conveying stage obtains reaction force. In FIG. 4, although the stage base 8A serves as the stationary part 27 of the conveying stage, depending on the construction of the stage, the stationary part of the conveying stage is not limited to the stage base 8A. The reaction force is transmitted from the stage base 8A to the base 8, the sample chamber bottom partition, the sample chamber side partition 3B, and the reaction force transmission member 35. The reaction force transmission member 35, which connects the sample chamber side partition 3B with the linear motor M, transmits the reaction force obtained by the stage base 8A, consequently the reaction force obtained by the entire portion above the second mounting 5B, from the sample chamber side partition 3B to the linear motor M arranged outside the sample chamber 3. The linear motor M, arranged between the reaction force transmission member 35 and the strut 14 on the floor, generates an equal amount of force, opposing against the reaction force transmitted through the reaction force transmission member 35, to cancel the reaction force. In this stage, in order not to generate torque in the vertical direction with respect to the drawing in FIG. 4 (pitching direction) due to the output of the linear motor M and the reaction force, the position of the linear motor M in the height direction is set about equal to the barycenter of the movable part 26 of the conveying stage. Furthermore, two of the reaction force receivers are provided in the vertical direction with respect to the drawing in FIG. 4 so as not to generate torque in the vertical direction (rolling direction). The reaction force receivers generate opposing force against the reaction force at two positions, and output the force in a way that the resultant force has an equal amount but an opposite direction to that of the reaction force, and has zero torque. The above description applies to the case of decelerating the conveying stage 26. It is effective that the linear motor M generates opposing force against the reaction force in real time and performs feedback-controlling or feedforward-controlling on the acceleration or deceleration of the conveying stage 26. The linear motor M that is a non-contact actuator reduces vibration disturbance from the floor which is transmitted to the reaction force transmission member 35 through the strut 14.

The above description has been given on a case where the conveying stage is accelerated or decelerated in the horizontal direction in FIG. 4. The similar description applies to a case where the conveying stage 26 is accelerated or decelerated in the vertical direction with respect to the drawing. To cancel the reaction force in this case, two reaction force receivers (not shown) are provided next to the sample chamber 3 in the vertical direction with respect to the drawing.

By virtue of providing the reaction force receivers, it is possible to reduce oscillation and vibration on the entire portion above the second mounting 5B, which is generated by the reaction force caused by counteraction of acceleration or deceleration of the conveying stage 26. Furthermore, since the relative position between the column 1 and the movable mirror 20 (consequently the relative position between the column 1 and the sample stage 4A (moreover the sample)) is servo-controlled, it is possible to reduce vibration of the column 1, the first reference structural member 11, and the second reference structural member 12.

Fifth Embodiment

Figure 5:
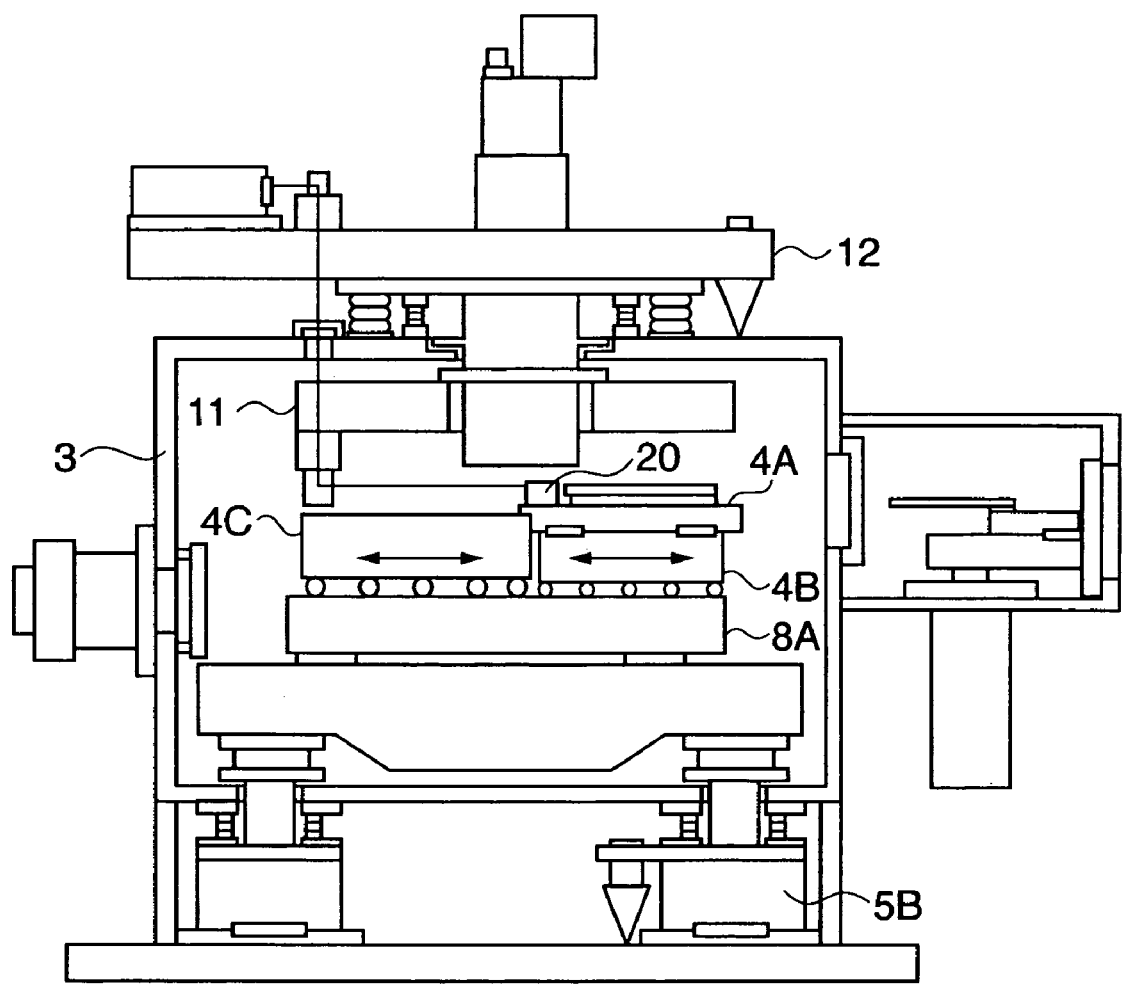
FIG. 5 is a diagram showing a brief construction of an electron beam exposure apparatus according to the fifth embodiment of the present invention.
Figure 6:
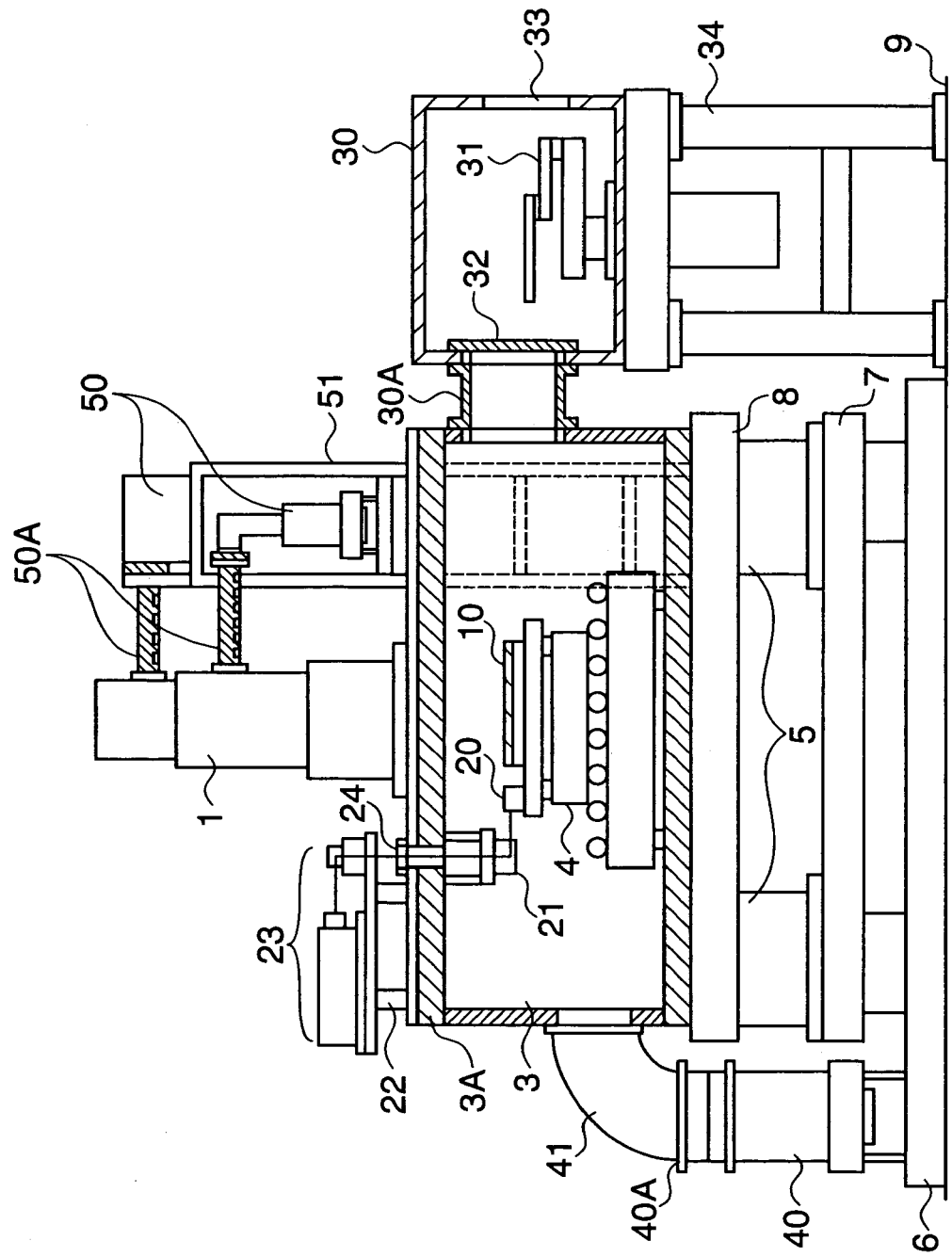
FIG. 6 is a diagram showing a construction of a conventional electron beam rendering apparatus.
Figure 7:
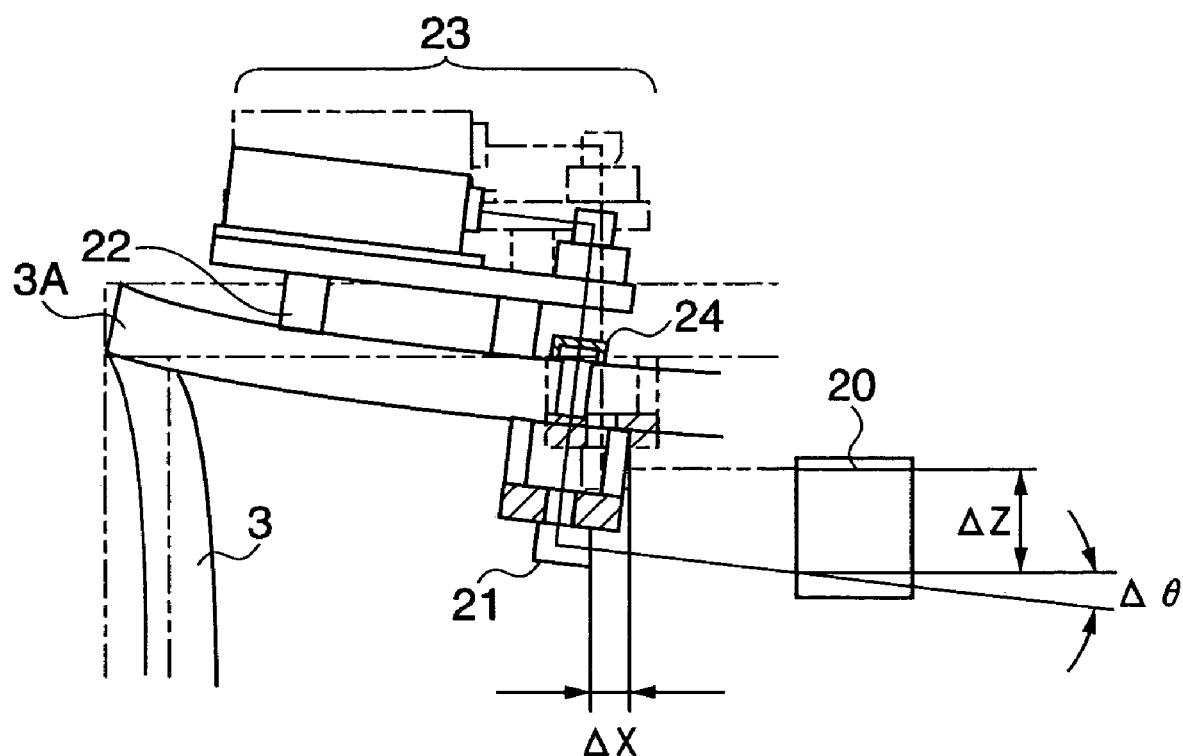
FIG. 7 is a view showing a problem of a conventional example.
Figure 8:
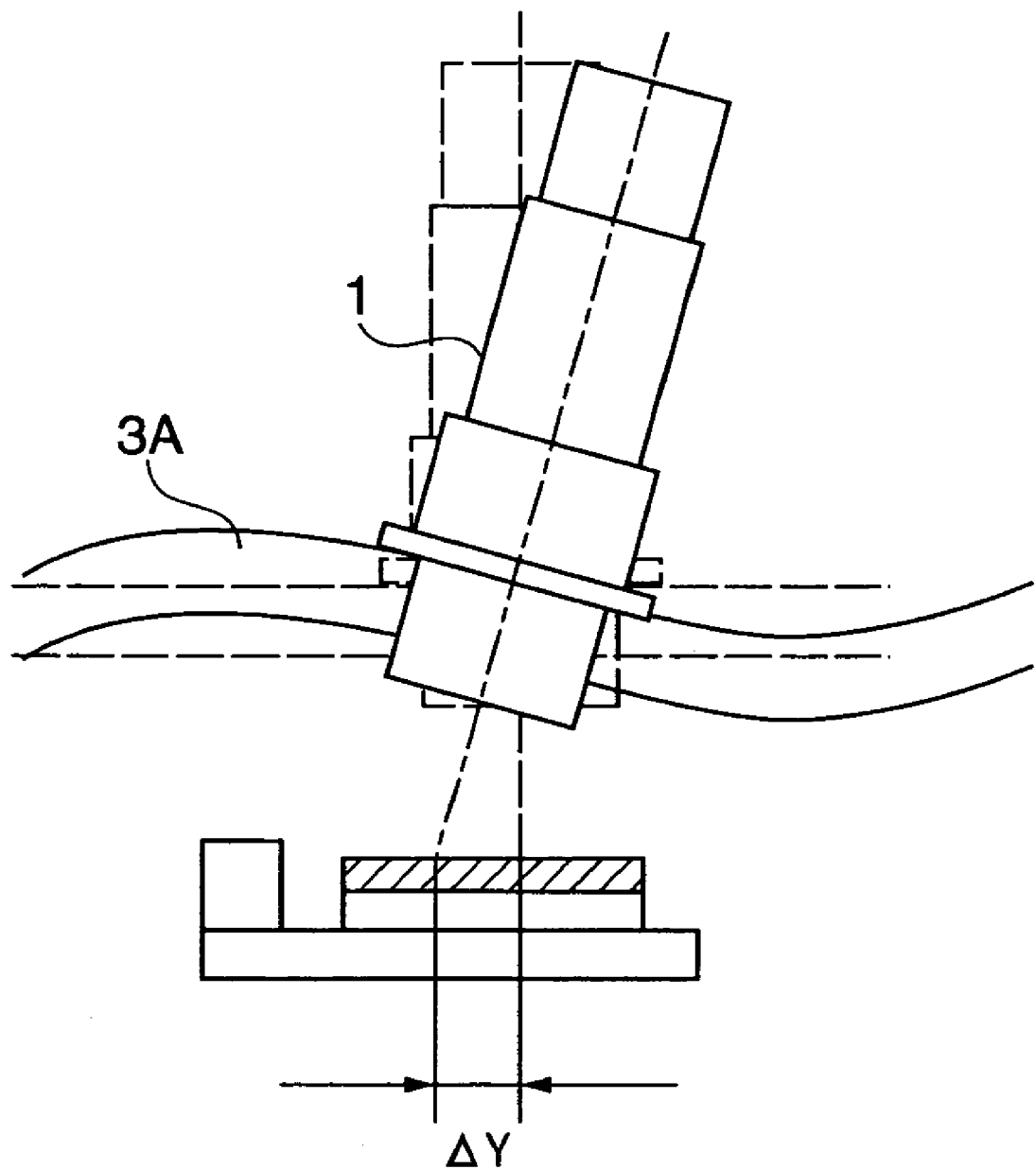
FIG. 8 is a view showing a problem of a conventional example.
Figure 9:
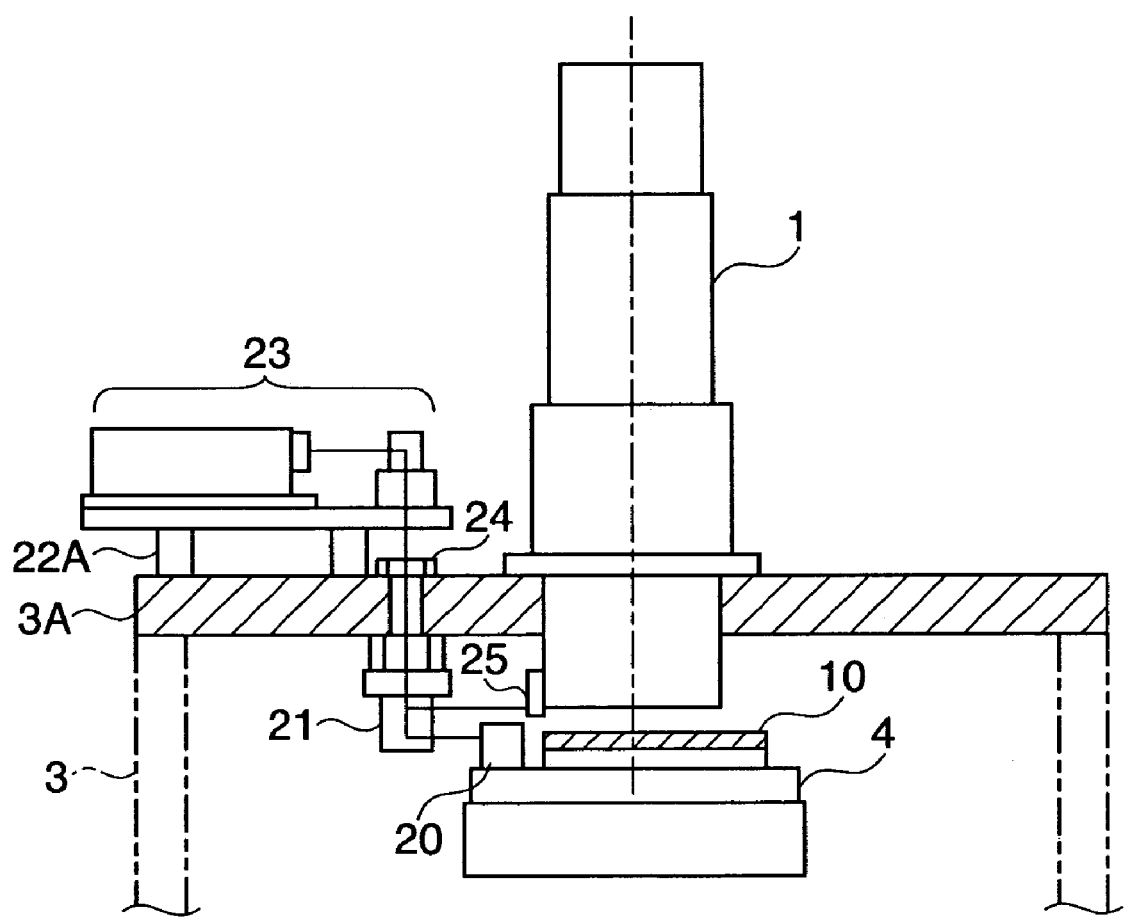
FIG. 9 is a diagram showing a construction of a conventional electron beam rendering apparatus.

FIG. 5 is a diagram showing a brief construction of an electron beam exposure apparatus according to the fifth embodiment of the present invention. In FIG. 5, the sample chamber 3, the column 1, and the stages have constructions according to the configuration mounted on the second mounting 5B in the first and second embodiments. A counter mass structure of the fifth embodiment, which is added to the configuration mounted on the second mounting 5B in the first and second embodiments, is described. By virtue of providing the counter mass structure, it is possible to reduce oscillation and vibration on the entire portion above the second mounting 5B, which is generated by the reaction force caused by counteraction of acceleration or deceleration of the movable part of the conveying stage 4B. Furthermore, since the relative position between the column 1 and the movable mirror 20 (consequently the relative position between the column 1 and the sample stage 4A (moreover the sample)) is servo-controlled, it is possible to reduce vibration of the column 1, the first reference structural member 11, and the second reference structural member 12.

A counter movable member 4C is mounted on the stage base 8A as similar to the conveying stage 4B. In FIG. 5, there are the counter movable member 4C which is movable in the horizontal direction on the stage base 8A, and a counter movable member (not shown) which is movable in the vertical direction with respect to the drawing. Each of the counter movable members can move only with respect to one-axis direction in the horizontal direction. The counter movable members and the conveying stage 4B do not interfere on the stage base 8A.

In a case where the movable part of the conveying stage is horizontally accelerated in FIG. 5, the movable part of the conveying stage employs an actuator (not shown) provided on the conveying stage 4B to produce thrust between the movable part and stationary part of the conveying stage, thereby obtaining acceleration force. Because of the counteraction of the acceleration force (thrust), the stationary part of the conveying stage obtains reaction force. In FIG. 5, the stage base 8A serves as the stationary part of the conveying stage. Along with the acceleration of the movable part of the conveying stage, the counter movable member 4C which is movable in the horizontal direction employs an actuator (not shown) provided on the movable member 4C to produce thrust between the movable part and the stationary part of the counter movable member, thereby obtaining acceleration force. Because of the counteraction of the acceleration force (thrust), the stationary part of the counter movable member obtains reaction force. In this case, the counter movable member 4C accelerates in the opposite direction to the acceleration direction of the movable part of the conveying stage. In FIG. 5, the stage base 8A corresponds to the stationary part of the counter movable member.

The reaction force given to the stage base 8A by the movable part of the conveying stage and the reaction force given to the stage base 8A by the counter movable member 4C are generated for an equal amount in the opposite directions so as to cancel the reaction force in the stage base 8A. As described above, since the reaction force generated by acceleration of the conveying stage 4B is transmitted to the entire portion above the second mounting 5B through the stationary part of the conveying stage and causes oscillation or vibration on the entire portion above the second mounting 5B, reaction force generated by acceleration of the counter movable member is utilized so that the two reaction force cancel each other. Accordingly, it is possible to reduce oscillation and vibration on the entire portion above the second mounting 5B.

In order not to generate torque in the vertical direction with respect to the drawing in FIG. 5 (pitching direction) due to the reaction force generated by acceleration of the movable part of the conveying stage and the reaction force generated by acceleration of the counter movable member 4C, the height of the barycenter of the counter movable member is set about equal to the barycenter of the movable part of the conveying stage. Furthermore, two of the counter movable members 4C are provided in a way to sandwich the movable part of the conveying stage in the vertical direction with respect to the drawing in FIG. 5, so as not to generate torque in the vertical direction (rolling direction). The counter movable members generate, at two positions, reaction force that cancels the reaction force generated by acceleration of the movable part of the conveying stage, and output the force in a way that the resultant force has an equal amount but an opposite direction to that of the reaction force generated by acceleration of the movable part of the conveying stage, and has zero torque. The above description applies to the case of decelerating the conveying stage 4B. It is effective that the counter movable member 4C accelerates or decelerates in real time in response to the acceleration or deceleration of the movable part of the conveying stage, and performs feedback-controlling or feedforward-controlling on the acceleration or deceleration of the movable part of the conveying stage.

The above description has been given on a case where the movable part of the conveying stage is accelerated or decelerated in the horizontal direction in FIG. 5. The similar description applies to a case where the movable part of the conveying stage is accelerated or decelerated in the vertical direction with respect to the drawing. To cancel the reaction force in this case, two counter movable members (not shown) are provided on the left and right of the conveying stage 4B.

In FIG. 5, although the stage base 8A serves as the stationary part of the conveying stage, depending on the construction of the stage, the stationary part of the conveying stage is not limited to the stage base 8A. Furthermore, although the stage base 8A also serves as the stationary part of the counter movable member, depending on the construction of the stage, the stationary part of the counter movable member is not limited to the stage base 8A.

By virtue of providing the counter movable members 4C, it is possible to reduce oscillation and vibration on the entire portion above the second mounting 5B, which is generated by the reaction force caused by counteraction of acceleration or deceleration of the conveying stage 4B. Furthermore, since the relative position between the column 1 and the movable mirror 20 (consequently the relative position between the column 1 and the sample stage 4A (moreover the sample)) is servo-controlled, it is possible to reduce vibration of the column 1, the first reference structural member 11, and the second reference structural member 12.

In the above-described embodiment, by virtue of an electromagnetic stage which is characterized by having at least two parallel-arranged electromagnets for generating thrust in the same direction, in which the orientations of the magnetic flux in the magnetic paths of the respective electromagnets are opposite to each other, it is possible to achieve an electromagnetic substrate stage that can reduce fluctuation of the magnetic field leakage at least in the neighborhood of the substrate. This enables simplification and weight saving of the magnetic shield, and realizes high-speed acceleration and deceleration as well as a high-speed stage. As a result, it is possible to provide a high-speed high-precision electron beam exposure apparatus.

Sixth Embodiment

Figure 10:
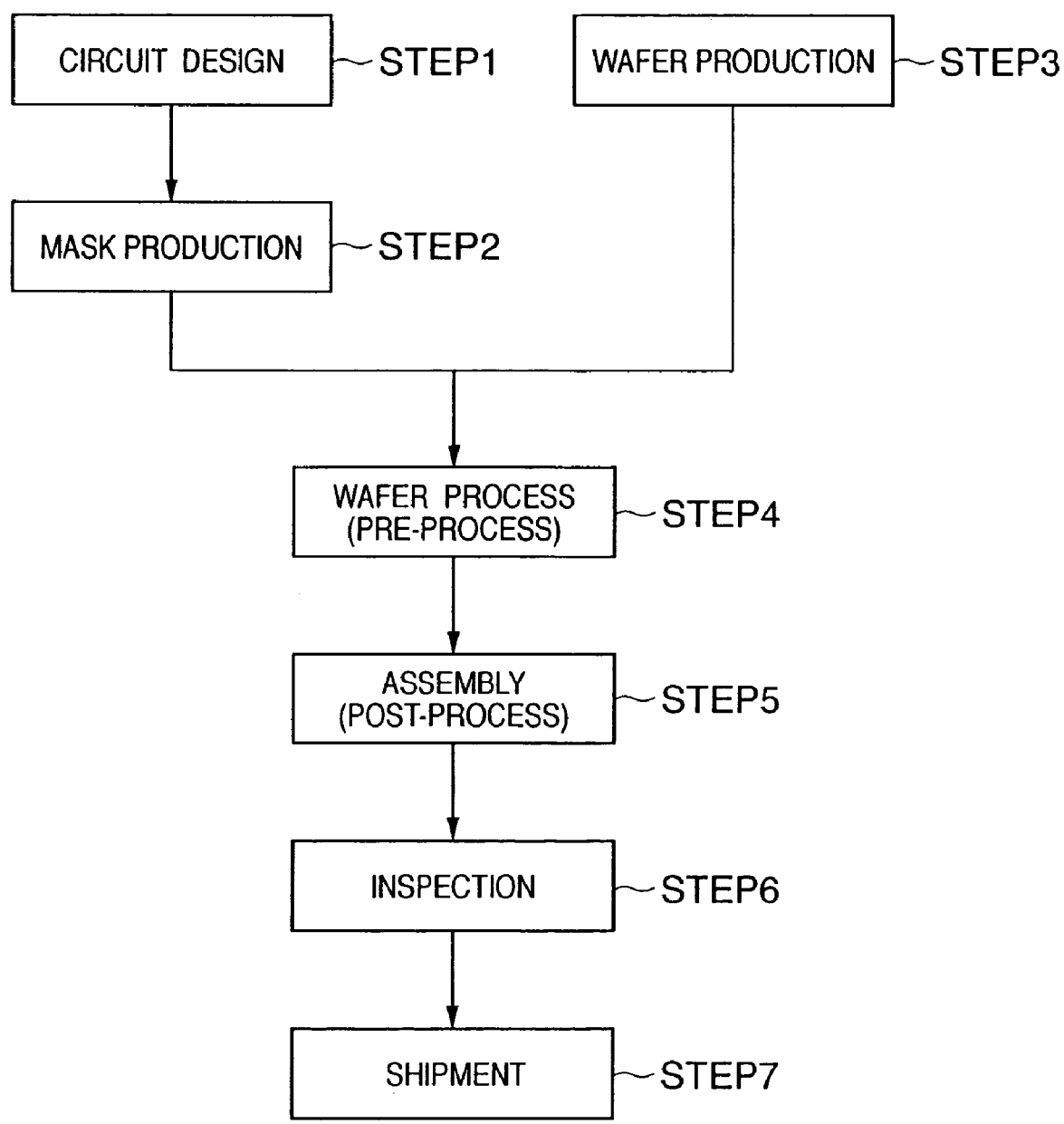
FIG. 10 is a diagram showing a flow of an overall semiconductor device manufacturing process.

Next, as the sixth embodiment of the present invention, a semiconductor device manufacturing process employing an exposure apparatus according to one of the first to fifth embodiments is described. FIG. 10 shows a flow of an overall semiconductor device manufacturing process. In step 1 (circuit design), a circuit of a semiconductor device is designed. In step 2 (mask production), a mask is produced based on the designed circuit pattern.

Meanwhile, in step 3 (wafer production), a wafer is produced with a material such as silicon. In step 4 (wafer process), which is called a pre-process, an actual circuit is formed on the wafer using the mask and the wafer by the above-described exposure apparatus employing a lithography technique. In step 5 (assembly), which is called a post-process, a semiconductor chip is manufactured using the wafer produced in step 4. Step 5 includes an assembling process (dicing, bonding), a packaging process (chip embedding) and so on. In step 6 (inspection), the semiconductor device manufactured in step 5 is subjected to inspection such as an operation-check test, durability test and so on. The semiconductor device manufactured in the foregoing processes is shipped in step 7.

The foregoing wafer process in step 4 comprises the following steps: an oxidization step of oxidizing the wafer surface, a CVD step of depositing an insulating film on the wafer surface, an electrode forming step of depositing electrodes on the wafer, an ion implantation step of implanting ion on the wafer, a resist processing step of coating a photosensitive agent on-the wafer, an exposure -step of transferring the circuit pattern on the resist-processed wafer by the above-described exposure apparatus, a development step of developing the wafer exposed in the exposure step, an etching step of removing portions other than the resist image developed in the development step, and a resist separation step of removing unnecessary resist after the etching process. By repeatedly executing the foregoing steps, multiple circuit patterns are formed on the wafer.

The present invention is not limited to the above embodiments and various changes and modifications can be made within the spirit and scope of the present invention. Therefore, to apprise the public of the scope of the present invention, the following claims are made.

CLAIM OF PRIORITY

This application claims priority from Japanese Patent Application No. 2004-074209 filed on Mar. 16, 2004, which is hereby incorporated by reference herein.

What is claimed is:

1. An electron beam exposure apparatus comprising:
a column for irradiating an electron beam to a sample;
a sample chamber having a vacuum exhaustion unit for controlling an internal unit to a vacuum atmosphere;
a stage, arranged in said sample chamber, for holding and moving the sample; and
a first mounting for elastically supporting said column with respect to said sample chamber.

2. The electron beam exposure apparatus according to claim 1, further comprising:
an interferometer, arranged in said sample chamber, for measuring a position of said stage; and
a first fixing member for fixing said interferometer to said column.

3. The electron beam exposure apparatus according to claim 2, wherein said stage performs aligning based on a measurement result of said interferometer.

4. The electron beam exposure apparatus according to claim 2, wherein said column comprises a correction system for correcting an orbit of an electron beam based on a measurement result of said interferometer.

5. The electron beam exposure apparatus according to claim 2, further comprising:
an optical system, arranged outside said sample chamber, for supplying said interferometer with measurement light; and
a second fixing member for fixing said optical system to said column.

6. The electron beam exposure apparatus according to claim 1, further comprising a first bellows partition connected to said column and said sample chamber in a way to seal a gap between said column and said sample chamber.

7. The electron beam exposure apparatus according to claim 1, further comprising a first magnetic shield unit for attenuating magnetism that passes through the gap between said column and said sample chamber.

8. The electron beam exposure apparatus according to claim 7, wherein said first magnetic shield unit is configured in a way that a magnetic shield provided on an external wall portion of said column and a magnetic shield provided on an upper wall unit of said sample chamber do not come in contact with each other, and respectively have large areas facing each other.

9. The electron beam exposure apparatus according to claim 1, further comprising:
a stage base; and
a second mounting for elastically supporting said stage base with respect to a base member.

10. The electron beam exposure apparatus according to claim 9, further comprising:
a second bellows partition connected to said sample chamber and said second mounting in a way to seal an opening of said sample chamber provided for said second mounting; and
a second magnetic shield unit for attenuating magnetism that passes through the opening of said sample chamber provided for said second mounting.

11. The electron beam exposure apparatus according to claim 9, further comprising:
a second displacement sensor for measuring a relative displacement between said stage base and said base member;
a second accelerometer for measuring acceleration of said stage base; and
a second actuator for changing a relative displacement between said stage base and said base member based on a measurement result of said second displacement sensor and a measurement result of said second accelerometer.

12. The electron beam exposure apparatus according to claim 9, further comprising a reaction force receiver for dissipating reaction force to said base member, said reaction force being received by said stage base at the time of acceleration or deceleration of said stage.

13. The electron beam exposure apparatus according to claim 12, wherein said reaction force receiver comprises a strut fixed to said base member, a reaction force transmission member fixed to said stage base, and a linear motor arranged between the strut and the reaction force transmission member, said apparatus further comprising:
a third bellows partition connected to said sample chamber and said reaction force transmission member in a way to seal an opening of said sample chamber provided for said reaction force transmission member; and
a third magnetic shield unit for attenuating magnetism that passes through the opening of said sample chamber provided for said reaction force transmission member.

14. The electron beam exposure apparatus according to claim 9, further comprising a counter mass mechanism for moving a counter member so as to cancel reaction force, which is received by said stage base at the time of acceleration or deceleration of said stage.

15. The electron beam exposure apparatus according to claim 14, wherein movement of said stage and movement of said counter member are realized by respective electromagnets, and directions of magnetic flux of the electromagnets are opposite to each other.

16. The electron beam exposure apparatus according to claim 1, further comprising a second mounting for elastically supporting said sample chamber with respect to a base member.

17. The electron beam exposure apparatus according to claim 16, further comprising a reaction force receiver for dissipating reaction force to said base member, said reaction force being received by said sample chamber at the time of acceleration or deceleration of said stage.

18. A device manufacturing method comprising:
a step of exposing the sample by said electron beam exposure apparatus according to claim 1; and
a step of developing the sample which has been subjected to exposure.

19. An electron beam exposure apparatus comprising:
a column for irradiating an electron beam to a sample;
a sample chamber having a vacuum exhaustion unit for controlling an internal unit to a vacuum atmosphere;
a stage, arranged in said sample chamber, for holding and moving the sample; and
a mounting for elastically supporting said column with respect to a base member; and further comprising: a first displacement sensor for measuring a relative displacement between said column and said sample chamber; a first accelerometer for measuring acceleration of said column; and a first actuator for changing a relative displacement between said column and said sample chamber based on a measurement result of said first displacement sensor and a measurement result of said first accelerometer.

20. A device manufacturing-method comprising:
a step of exposing the sample by said electron beam exposure apparatus according to claim 19; and
a step of developing the sample which has been subjected to exposure.

* * * * *

UNITED STATES PATENT AND TRADEMARK OFFICE
CERTIFICATE OF CORRECTION

PATENT NO. : 7,230,257 B2
APPLICATION NO. : 11/074645
DATED : June 12, 2007
INVENTOR(S) : Shinji Uchida It is certified that error appears in the above-identified patent and that said Letters Patent is hereby corrected as shown below:

COLUMN 2:
    Line 39, "these fluctuation," should read -- this fluctuation, --.

COLUMN 7:
    Line 62, "column I" should read -- column 1 --.

COLUMN 9:
    Line 6, "vacuum pump 4.0" should read -- vacuum pump 40 --.

COLUMN 10:
    Line 53, "maintains" should read -- maintain --.

COLUMN 12:
    Line 50, "movable-mirror" should read -- movable mirror --.
    Line 67, "chamber 30." should read -- chamber 30. Then, the --

COLUMN 13:
    Line 1, "Then, the" should be deleted and the left margin should be closed up.

COLUMN 16:
    Line 25, "unit 48-is" should read -- unit 48 is --.

COLUMN 20:
    Line 7, "two reaction force" should read -- two reaction forces --.
    Line 17, "member" should read -- member 4C --.
    Line 23, "members" should read -- members 4C --.
    Line 43, "members" should read -- members 4C --.
    Line 51, "member" should read -- member 4C --.
    Line 53, "member" should read -- member 4C --.

COLUMN 21:
    Line 42, "on-the wafer" should read -- on the wafer -- and "exposure -step" should read -- exposure step --.

UNITED STATES PATENT AND TRADEMARK OFFICE
CERTIFICATE OF CORRECTION

PATENT NO. : 7,230,257 B2
APPLICATION NO. : 11/074645
DATED : June 12, 2007
INVENTOR(S) : Shinji Uchida It is certified that error appears in the above-identified patent and that said Letters Patent is hereby corrected as shown below:

COLUMN 22 Claim 1:
　　　Line 4, "chamber." should read as follows:

-- chamber; and
　　　　　further comprising:
　　　　　　　　a first displacement sensor for measuring a relative
　　　　　displacement between said column and said sample chamber;
　　　　　　　　a first accelerometer for measuring acceleration of said column;
　　　　　　　　and a first actuator for changing a relative displacement
　　　　　between said column and said sample chamber based on a measurement
　　　　　result of said first displacement sensor and a measurement result of said
　　　　　first accelerometer. --

COLUMN 24 Claim 19:
　　　Line 17, the second occurrence of "a" should be deleted.
　　　Line 18, "first" should read -- a first -- and the left margin should be indented to begin a new paragraph.
　　　Line 20, "ber; a first accelerometer for measuring acceleration of" should read -- ber; -- and a new paragraph should begin with "a first accelerometer for measuring acceleration of."
　　　Line 21, "said column; and a first actuator changing a relative" should read -- said column; and -- and a new paragraph should begin with "a first actuator changing a relative."
　　　Line 26 Claim 20, "manufacturing-method" should read -- manufacturing method --.

Signed and Sealed this

Twenty-fifth Day of March, 2008

JON W. DUDAS
*Director of the United States Patent and Trademark Office*